US011754741B2

(12) United States Patent
Guner et al.

(10) Patent No.: US 11,754,741 B2
(45) Date of Patent: Sep. 12, 2023

(54) METHOD FOR RESISTIVITY DETERMINATION WITH BOREHOLE IMAGERS

(71) Applicant: Halliburton Energy Services, Inc., Houston, TX (US)

(72) Inventors: Baris Guner, Houston, TX (US); Luis Emilio San Martin, Albuquerque, NM (US)

(73) Assignee: Halliburton Energy Services, Inc., Houston, TX (US)

( * ) Notice: Subject to any disclaimer, the term of this patent is extended or adjusted under 35 U.S.C. 154(b) by 0 days.

(21) Appl. No.: 17/555,240

(22) Filed: Dec. 17, 2021

(65) Prior Publication Data

US 2022/0107441 A1    Apr. 7, 2022

Related U.S. Application Data

(63) Continuation of application No. 16/605,176, filed as application No. PCT/US2018/061340 on Nov. 15, 2018, now Pat. No. 11,249,217.

(51) Int. Cl.
*G01V 3/38* (2006.01)
*G01V 3/20* (2006.01)
(Continued)

(52) U.S. Cl.
CPC ............ *G01V 3/38* (2013.01); *E21B 47/0025* (2020.05); *G01V 3/20* (2013.01); *E21B 47/00* (2013.01);
(Continued)

(58) Field of Classification Search
CPC ... G01V 3/38; G01V 3/20; G01V 3/24; G01V 1/16; G01V 3/00; E21B 47/0025;
(Continued)

(56) References Cited

U.S. PATENT DOCUMENTS 3,060,373 A    10/1962  Doll
3,132,298 A     5/1964  Doll et al.
(Continued)

FOREIGN PATENT DOCUMENTS

CA        685727      5/1964
CN      102635348    8/2012
(Continued)

OTHER PUBLICATIONS

ISRWO International Search Report and Written Opinion for PCT/US2017/061340 dated Aug. 9, 2019.
(Continued)

*Primary Examiner* — Daniel R Miller
*Assistant Examiner* — Christian T Bryant
(74) *Attorney, Agent, or Firm* — John W. Wustenberg; C. Tumey Law Group, PLLC

(57) ABSTRACT

A method and system for resistivity imaging. A method may comprise disposing a downhole tool into a borehole, applying a voltage difference between the array of injector electrodes, constructing a first set of formation images for each of the plurality of frequencies, applying a mud effect removal algorithm to produce a second set of formation images for each of the plurality of frequencies, applying a dielectric correction algorithm to each of the plurality of frequencies to produce a third set of formation images for each of the plurality of frequencies, and combining the first set of formation images, the second set of formation images, and the third set of formation images to obtain a blended image. A system for resistivity imaging may comprise a downhole tool. The downhole tool may comprises a pad, an array of injector electrodes, and one or more return electrodes.

20 Claims, 11 Drawing Sheets

(51) Int. Cl.

| | |
|---|---|
| *G01V 1/16* | (2006.01) |
| *E21B 47/00* | (2012.01) |
| *E21B 49/00* | (2006.01) |
| *G01V 3/00* | (2006.01) |
| *G01R 27/00* | (2006.01) |
| *G01V 3/24* | (2006.01) |
| *G01R 25/00* | (2006.01) |
| *E21B 47/002* | (2012.01) |

(52) U.S. Cl.
CPC .............. *E21B 49/00* (2013.01); *G01R 25/00* (2013.01); *G01R 27/00* (2013.01); *G01V 1/16* (2013.01); *G01V 3/00* (2013.01); *G01V 3/24* (2013.01)

(58) Field of Classification Search
CPC .......... E21B 47/00; E21B 49/00; G01R 25/00; G01R 27/00
See application file for complete search history.

(56) References Cited

U.S. PATENT DOCUMENTS

| | | | |
|---|---|---|---|
| 3,379,963 | A | 4/1968 | Saurenman |
| 3,379,964 | A | 4/1968 | Segesman |
| 3,579,098 | A | 5/1971 | Mougne |
| 4,251,773 | A | 2/1981 | Cailliau et al. |
| 4,468,623 | A | 8/1984 | Gianzero et al. |
| 4,545,242 | A | 10/1985 | Chan |
| 4,567,759 | A | 2/1986 | Ekstrom et al. |
| 4,692,908 | A | 9/1987 | Ekstrom et al. |
| 4,851,781 | A | 7/1989 | Marzetta et al. |
| 4,862,090 | A | 8/1989 | Vannier et al. |
| 5,008,625 | A | 4/1991 | Chen |
| 5,012,193 | A | 4/1991 | Chen |
| 5,038,378 | A | 8/1991 | Chen |
| 6,191,588 | B1 | 2/2001 | Chen |
| 7,397,259 | B1 | 7/2008 | Agarwal et al. |
| 7,511,654 | B1 | 3/2009 | Goldman et al. |
| RE42,493 | E | 6/2011 | Tabarovsky et al. |
| 8,299,796 | B2 * | 10/2012 | San Martin .............. G01V 3/24 324/303 |
| 8,579,037 | B2 | 11/2013 | Jacob |
| 2005/0133262 | A1 | 6/2005 | Chen et al. |
| 2005/0157943 | A1 * | 7/2005 | Ruggiero .............. G06T 3/4007 348/E5.075 |
| 2008/0272789 | A1 * | 11/2008 | San Martin .............. G01V 3/24 324/355 |
| 2010/0295548 | A1 | 11/2010 | Georgi et al. |
| 2012/0275658 | A1 | 11/2012 | Hurley et al. |
| 2015/0260874 | A1 | 9/2015 | Chen et al. |
| 2016/0130930 | A1 * | 5/2016 | Gelman ................ G06T 7/0004 382/109 |
| 2018/0203150 | A1 | 7/2018 | San Martin et al. |

FOREIGN PATENT DOCUMENTS

| | | |
|---|---|---|
| WO | 2017184164 | 10/2017 |
| WO | 2017205912 | 12/2017 |
| WO | 2019177588 | 9/2019 |

OTHER PUBLICATIONS

Richard Bloemenkamp, et al., Design and Field testing of a new high-definition microresistivity imaging tool engineered for oil based mud, SPWLA, May 2014.

SPWLA 61st Annual Logging Symposium, Guner, et al., Quantitative Demonstration of a High-Fidelity Oil-based Mud Resistivity Imager using a Controlled Experiment, Jun. 24 to Jul. 29, 2020.

Chen, et al. A Novel Array Laterolog Method, Oct. 1998.

SPLWA 38th Annual Logging Symposium, Vigne, et al., Strange Invasion Profiles: What Multiarray Induction Logs can tell us about how Oil-Based Mud affects the invasion process and wellbore stability Jun. 1997.

SPE22726, Safinya, et al., Improved Formation Imaging with Extended Microelectrical Arrays, 1991.

SPE30584, Smits, et al., High Resolution from a New Laterolog with /azimuthal Imaging, 1995.

SPE Formation Evaluation, Davies, et al., Azimuthal Resistivity Imaging: A New-Generation Laterolog, Sep. 1994.

SPE401, Suau, et al., The Dual Laterolog-R Tool, Jul. 1973.

Office Action Summary for U.S. Appl. No. 16/605,176 dated May 14, 2021.

Notice of Allowance for U.S. Appl. No. 16/605,176 dated Oct. 7, 2021.

* cited by examiner

FOR i=1,...,M; j=1,...,N

IF $|\bar{\bar{I}}(z_i, n_f, f_p)| <$ THRESH $$F\{\bar{\bar{I^P}}(z_i, n_f, f_k)\} = \bar{\bar{I^P}}(z_i, n_f, f_k)$$

ELSE $$F\{\bar{\bar{I^P}}(z_i, n_f, f_k)\} = \text{MEDIAN}\left\{\bar{\bar{I^P}}(z_i, n_f, f_k)\right\} \text{ OVER } f$$

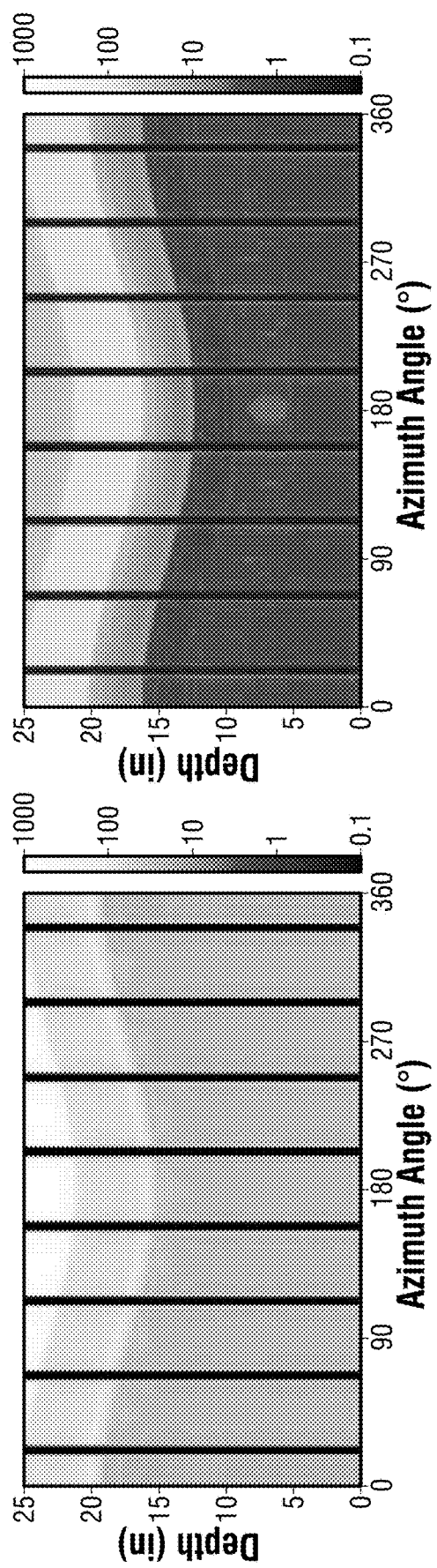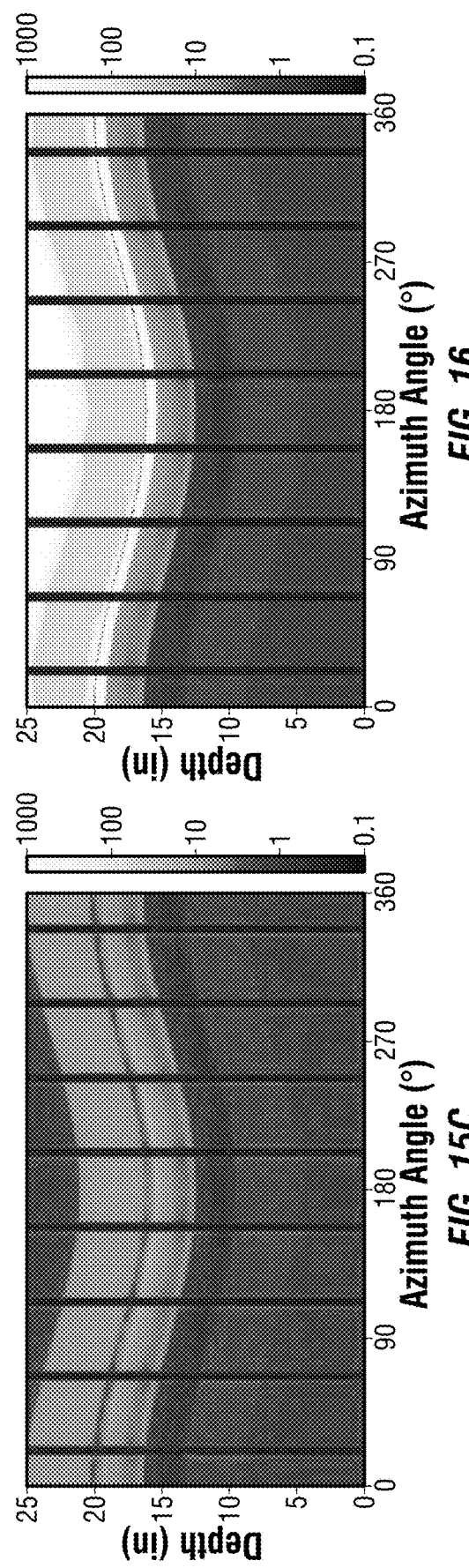
FIG. 15A
FIG. 15B
FIG. 15C
FIG. 16

METHOD FOR RESISTIVITY DETERMINATION WITH BOREHOLE IMAGERS

BACKGROUND

Boreholes drilled into subterranean formations may enable recovery of desirable fluids (e.g., hydrocarbons) using a number of different techniques. A downhole tool may be employed in subterranean operations to determine borehole and/or formation properties.

Traditionally, borehole imager tools may be used in obtaining a detailed characterization of reservoirs. These borehole imager tools may provide a resistivity image of the formation immediately surrounding the borehole. Borehole imager tools may be used to determine formation stratigraphy, dips of the formation layers as well as, borehole and formation stress. During drilling operations borehole imager tools may be particularly important in learning about thin beds and fracture locations. Oil based muds may provide higher performance than the water based muds and may be preferable in deep water environments where high temperature and pressure cause loss of water and in shale zones where water may cause swelling. However, oil based mud may be highly resistive. At low frequencies, this resistance may reduce the sensitivity of the borehole imager tools to the outside formation.

To overcome this effect, the tools may operate at high frequencies. At these high frequencies, pads on the borehole imager tools may become capacitively coupled to the formation, reducing the effect of the oil based mud. Additionally, when formation resistivity is high, oil based mud imagers may exhibit a dielectric roll-off effect that may cause the measured impedance to decrease as the formation resistivity increases. This effect may be more pronounced at higher operating frequencies, which may skew measurements from the borehole imager tool.

BRIEF DESCRIPTION OF THE DRAWINGS

For a detailed description of the preferred examples of the invention, reference will now be made to the accompanying drawings in which:

FIG. 14 illustrates an example of a blending function;

FIG. 15A-C illustrates an example of formation images of apparent resistivity; and FIG. 16 illustrates an example of a final, blended formation image of apparent resistivity.

DETAILED DESCRIPTION

The present disclosure relates generally to a system and method for combining the results of a mud effect removal algorithm, along with the results of a dielectric correction algorithm, to obtain a more accurate formation image of the formation surrounding the borehole over a wide range of formation parameters from a downhole device. The proposed system and method may increase the quality of the formation images obtained with oil based mud imagers through processing. In particular, a formation image may be provided with improved contrast in both low and high resistivity formations where traditional oil based mud imagers have performed poorly. In regions where a mud effect may be prevalent, the results obtained after mud effect removal at different operating frequencies may be similar. Additionally, in the regions where dielectric correction may be accurate, the processed results at different frequencies should match. Thus, it may be beneficial to combine the results of two such algorithms based on their frequency variations.

Figure 1:
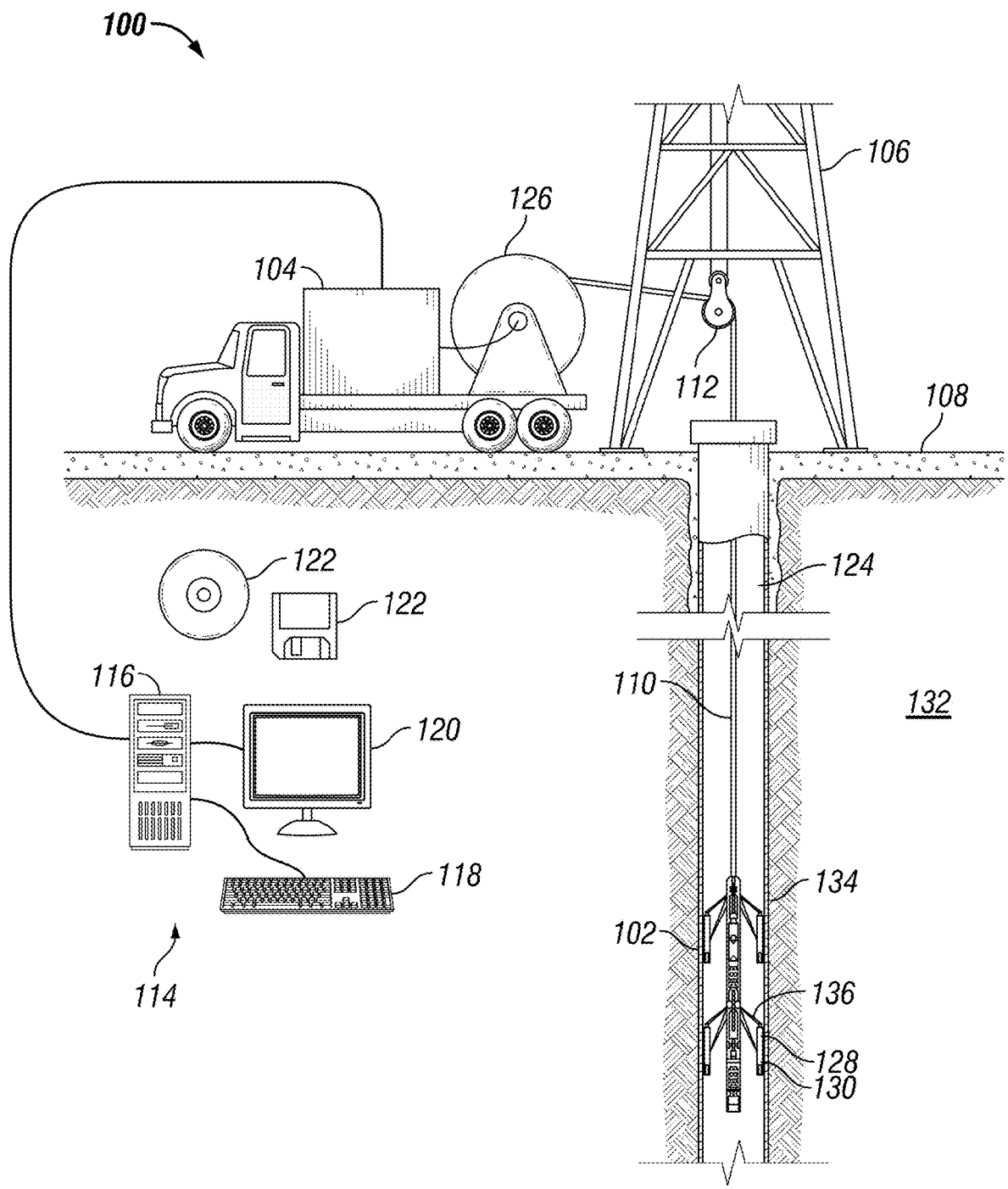
FIG. 1 illustrate an example of a well measurement system.

FIG. 1 illustrates a cross-sectional view of a well measurement system 100. As illustrated, well measurement system 100 may comprise downhole tool 102 attached to a vehicle 104. In examples, it should be noted that downhole tool 102 may not be attached to a vehicle 104. Downhole tool 102 may be supported by rig 106 at surface 108. Downhole tool 102 may be tethered to vehicle 104 through conveyance 110. Conveyance 110 may be disposed around one or more sheave wheels 112 to vehicle 104. Conveyance 110 may include any suitable means for providing mechanical conveyance for downhole tool 102, including, but not limited to, wireline, slickline, coiled tubing, pipe, drill pipe, drill string, downhole tractor, or the like. In some examples, conveyance 110 may provide mechanical suspension, as well as electrical connectivity, for downhole tool 102.

Conveyance 110 may comprise, in some instances, a plurality of electrical conductors extending from vehicle 104. Conveyance 110 may comprise an inner core of seven electrical conductors covered by an insulating wrap. An inner and outer steel armor sheath may be wrapped in a helix in opposite directions around the conductors. The electrical conductors may be used for communicating power and telemetry between vehicle 104 and downhole tool 102.

Conveyance 110 may lower downhole tool 102 in borehole 124. Generally, borehole 124 may include horizontal, vertical, slanted, curved, and other types of borehole geometries and orientations. Imaging tools may be used in uncased sections of the borehole. Measurements may be made by downhole tool 102 in cased sections for purposes such as calibration.

Figure 2:
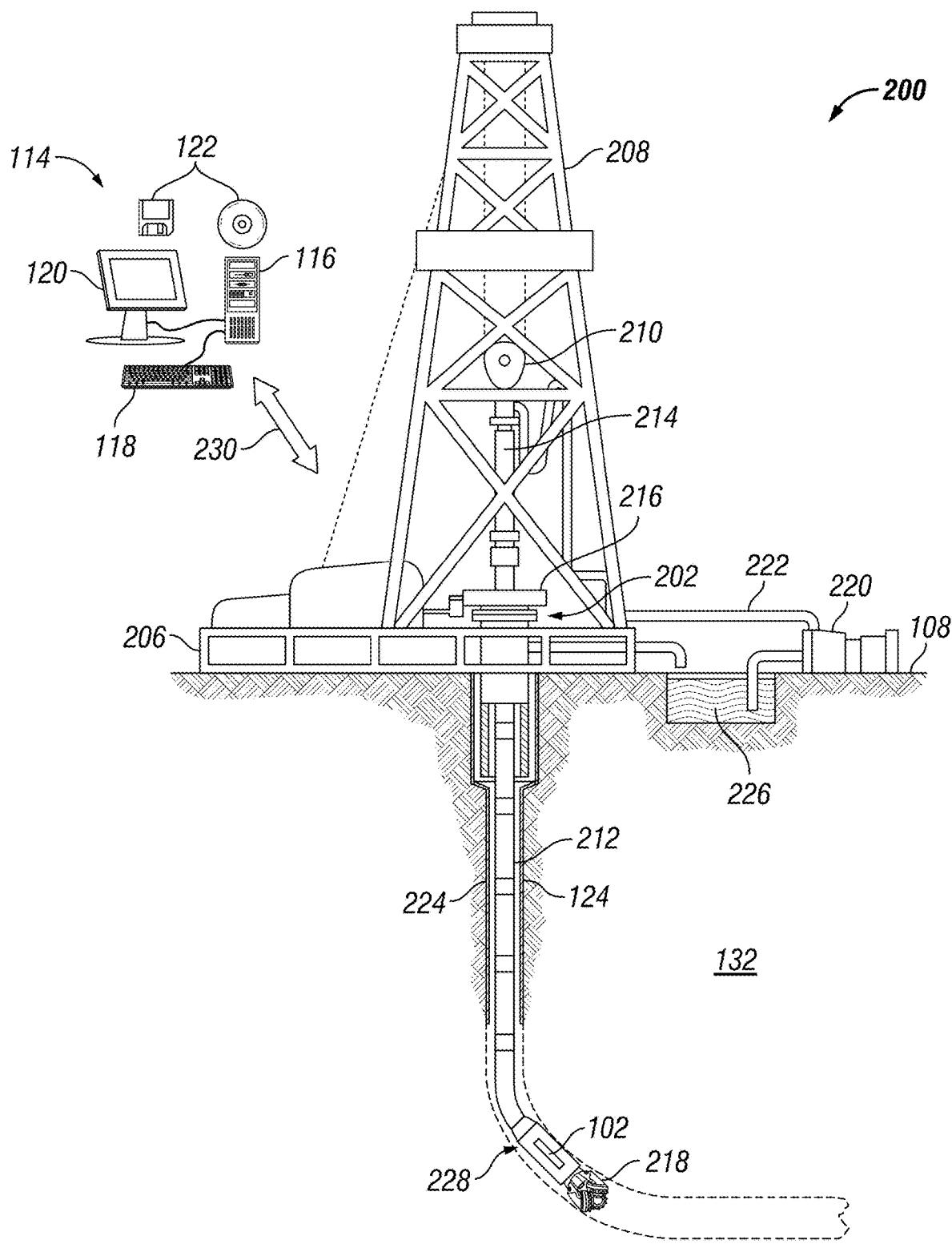
FIG. 2 illustrates another example of a well measurement system.

As illustrated, borehole 124 may extend through formation 132. As illustrated in FIG. 2, borehole 124 may extend generally vertically into the formation 132, however borehole 124 may extend at an angle through formation 132, such as horizontal and slanted boreholes. For example, although FIG. 2 illustrates a vertical or low inclination angle well, high inclination angle or horizontal placement of the well and equipment may be possible. It should further be noted that while FIG. 2 generally depicts a land-based operation, those skilled in the art may recognize that the principles described herein are equally applicable to subsea operations that employ floating or sea-based platforms and rigs, without departing from the scope of the disclosure.

Information from downhole tool 102 may be gathered and/or processed by information handling system 114. For example, signals recorded by downhole tool 102 may be stored on memory and then processed by downhole tool 102. The processing may be performed real-time during data acquisition or after recovery of downhole tool 102. Processing may alternatively occur downhole or may occur both downhole and at surface. In some examples, signals recorded by downhole tool 102 may be conducted to information handling system 114 by way of conveyance 110. Information handling system 114 may process the signals, and the information contained therein may be displayed for an operator to observe and stored for future processing and reference. Information handling system 114 may also contain an apparatus for supplying control signals and power to downhole tool 102.

Systems and methods of the present disclosure may be implemented, at least in part, with information handling system 114. While shown at surface 108, information handling system 114 may also be located at another location, such as remote from borehole 124. Information handling system 114 may include any instrumentality or aggregate of instrumentalities operable to compute, estimate, classify, process, transmit, receive, retrieve, originate, switch, store, display, manifest, detect, record, reproduce, handle, or utilize any form of information, intelligence, or data for business, scientific, control, or other purposes. For example, an information handling system 114 may be a processing unit 116, a network storage device, or any other suitable device and may vary in size, shape, performance, functionality, and price. Information handling system 114 may include random access memory (RAM), one or more processing resources such as a central processing unit (CPU) or hardware or software control logic, ROM, and/or other types of nonvolatile memory. Additional components of the information handling system 114 may include one or more disk drives, one or more network ports for communication with external devices as well as an input device 118 (e.g., keyboard, mouse, etc.) and video display 120. Information handling system 114 may also include one or more buses operable to transmit communications between the various hardware components.

Alternatively, systems and methods of the present disclosure may be implemented, at least in part, with non-transitory computer-readable media 122. Non-transitory computer-readable media 122 may include any instrumentality or aggregation of instrumentalities that may retain data and/or instructions for a period of time. Non-transitory computer-readable media 122 may include, for example, storage media such as a direct access storage device (e.g., a hard disk drive or floppy disk drive), a sequential access storage device (e.g., a tape disk drive), compact disk, CD-ROM, DVD, RAM, ROM, electrically erasable programmable read-only memory (EEPROM), and/or flash memory; as well as communications media such as wires, optical fibers, microwaves, radio waves, and other electromagnetic and/or optical carriers; and/or any combination of the foregoing.

As discussed below, methods may utilize an information handling system 114 to determine and display a high resolution resistivity image of formation 132 immediately surrounding borehole 124. This high resolution resistivity image may depict boundaries of subsurface structures, such as a plurality of layers disposed in formation 132. These formation images may be used in reservoir characterization. Formation images with high resolution may allow accurate identification of thin beds and other fine features such as fractures, clasts and vugs. These formation images may provide information about the sedimentology, lithology, porosity and permeability of formation 132. The formation images may complement, or in some cases replace, the process of coring.

In examples, rig 106 includes a load cell (not shown) which may determine the amount of pull on conveyance 110 at the surface of borehole 124. Information handling system 114 may comprise a safety valve which controls the hydraulic pressure that drives drum 126 on vehicle 104 which may reels up and/or release conveyance 110 which may move downhole tool 102 up and/or down borehole 124. Conveyance 110 may provide a means of disposing downhole tool 102 into borehole 124. The safety valve may be adjusted to a pressure such that drum 126 may only impart a small amount of tension to conveyance 110 over and above the tension necessary to retrieve conveyance 110 and/or downhole tool 102 from borehole 124. The safety valve is typically set a few hundred pounds above the amount of desired safe pull on conveyance 110 such that once that limit is exceeded; further pull on conveyance 110 may be prevented.

Downhole tool 102 may comprise a plurality of electrodes, such as button array 128. Downhole tool 102 may also comprise a return electrode 130. It should be noted that the plurality of electrodes of button array 128 may be any suitable electrode and is should be further noted that return electrode 130 may be any suitable electrode. Button array 128 and/or return electrode 130 may be disposed on at least one pad 134 in any suitable order. For example, a pad 134 may include only button arrays 128 and/or return electrodes 130. Further, a pad 134 may comprise both button array 128 and return electrodes 130. Pads 134 may be attached to at least one arm 136 that may extend from downhole tool 102. Arm 136 may extend pad 134 away from downhole tool 102. In examples, arm 136 may place pad 134 in contact with borehole 124. It should be noted that there may be a plurality of arms 136. One or more arms 136 may place an arrangement of button arrays 128 and/or return electrode 130 in close proximity to the wall of borehole 124.

During operations, an operator may energize an individual electrode, or any number of electrodes, of button array 128. A voltage may be applied between the electrode and return electrode 130. The level of the voltage may be controlled by information handling system 114. This may cause currents to be transmitted through the electrode of button array 128. It should be noted that there may be any number of currents transmitted into formation 132. These currents may travel through the mud disposed in borehole 124 and formation 132 and may reach back to return electrode 130. The amount of current emitted by each electrode may be inversely proportional to the impedance seen by the electrode. This impedance may be affected by the properties of formation 132 and the mud directly in front of each electrode of button array 124. Therefore, current emitted by each electrode may be measured and recorded in order to obtain a formation image of the resistivity of formation 132.

To produce a resistivity image of formation 132, a current may be transmitted from at least one electrode of button array 128 and return to return electrode 130. These two electrodes may be referred to as the current electrodes. Then, the voltage drop across the electrode of button array 128 may be measured and used to estimate the impedance of formation 132. In these alternative implementations, electrodes may be referred to as voltage electrodes or monitor electrodes. Proposed method may operate in any of the two designs above or any other similar oil based mud resistivity imager tool without any limitations.

In examples, downhole tool 102 may operate with additional equipment (not illustrated) on surface 108 and/or disposed in a separate well measurement system (not illustrated) to record measurements and/or values from formation 132 to render a resistivity image of formation 132. Without limitation, downhole tool 102 may be connected to and/or controlled by information handling system 114, which may be disposed on surface 108. Without limitation, information handling system 114 may be disposed down hole in downhole tool 102. Processing of information recorded may occur down hole and/or on surface 108. In addition to, or in place of processing at surface 108, processing may occur downhole. Processing occurring downhole may be transmitted to surface 108 to be recorded, observed, and/or further analyzed. Additionally, information recorded on information handling system 114 that may be disposed down hole may be stored until downhole tool 102 may be brought to surface 108. In examples, information handling system 114 may communicate with downhole tool 102 through a fiber optic cable (not illustrated) disposed in (or on) conveyance 110. In examples, wireless communication may be used to transmit information back and forth between information handling system 114 and downhole tool 102. Information handling system 114 may transmit information to downhole tool 102 and may receive as well as process information recorded by downhole tool 102. In examples, a downhole information handling system (not illustrated) may include, without limitation, a microprocessor or other suitable circuitry, for estimating, receiving and processing signals from downhole tool 102. Downhole information handling system (not illustrated) may further include additional components, such as memory, input/output devices, interfaces, and the like. In examples, while not illustrated, downhole tool 102 may include one or more additional components, such as analog-to-digital converter, filter and amplifier, among others, that may be used to process the measurements of downhole tool 102 before they may be transmitted to surface 108. Alternatively, raw measurements from b downhole tool 102 may be transmitted to surface 108.

Any suitable technique may be used for transmitting signals from downhole tool 102 to surface 108. As illustrated, a communication link (which may be wired or wireless and may be disposed in conveyance 110, for example) may be provided that may transmit data from downhole tool 102 to an information handling system 114 at surface 108.

FIG. 2 illustrates an example in which downhole tool 102 (Referring to FIG. 1) may be disposed in a drilling system 200. As illustrated, borehole 124 may extend from a wellhead 202 into formation 132 from surface 108. As illustrated, a drilling platform 206 may support a derrick 208 having a traveling block 210 for raising and lowering drill string 212. Drill string 212 may include, but is not limited to, drill pipe and coiled tubing, as generally known to those skilled in the art. A kelly 214 may support drill string 212 as it may be lowered through a rotary table 216. A drill bit 218 may be attached to the distal end of drill string 212 and may be driven either by a downhole motor and/or via rotation of drill string 212 from surface 108. Without limitation, drill bit 218 may include, roller cone bits, PDC bits, natural diamond bits, any hole openers, reamers, coring bits, and the like. As drill bit 218 rotates, it may create and extend borehole 124 that penetrates various formations 132. A pump 220 may circulate drilling fluid through a feed pipe 222 to kelly 214, downhole through interior of drill string 212, through orifices in drill bit 218, back to surface 108 via annulus 224 surrounding drill string 212, and into a retention pit 226.

With continued reference to FIG. 2, drill string 212 may begin at wellhead 202 and may traverse borehole 124. Drill bit 218 may be attached to a distal end of drill string 212 and may be driven, for example, either by a downhole motor and/or via rotation of drill string 212 from surface 108 (Referring to FIG. 1). Drill bit 218 may be a part of bottom hole assembly 228 at distal end of drill string 212. Bottom hole assembly 228 may further comprise downhole tool 102 (Referring to FIG. 1). Downhole tool 102 may be disposed on the outside and/or within bottom hole assembly 228. Downhole tool 102 may comprise test cell 234. As will be appreciated by those of ordinary skill in the art, bottom hole assembly 228 may be a measurement-while drilling (MWD) or logging-while-drilling (LWD) system.

Without limitation, bottom hole assembly 228 may be connected to and/or controlled by information handling system 114 (Referring to FIG. 1), which may be disposed on surface 108. Without limitation, information handling system 114 may be disposed down hole in bottom hole assembly 228. Processing of information recorded may occur down hole and/or on surface 108. Processing occurring downhole may be transmitted to surface 108 to be recorded, observed, and/or further analyzed. Additionally, information recorded on information handling system 114 that may be disposed down hole may be stored until bottom hole assembly 228 may be brought to surface 108. In examples, information handling system 114 may communicate with bottom hole assembly 228 through a fiber optic cable (not illustrated) disposed in (or on) drill string 212. In examples, wireless communication may be used to transmit information back and forth between information handling system 114 and bottom hole assembly 228. Information handling system 114 may transmit information to bottom hole assembly 228 and may receive as well as process information recorded by bottom hole assembly 228. In examples, a downhole information handling system (not illustrated) may include, without limitation, a microprocessor or other suitable circuitry, for estimating, receiving and processing signals from bottom hole assembly 228. Downhole information handling system (not illustrated) may further include additional components, such as memory, input/output devices, interfaces, and the like. In examples, while not illustrated, bottom hole assembly 228 may include one or more additional components, such as analog-to-digital converter, filter and amplifier, among others, that may be used to process the measurements of bottom hole assembly 228 before they may be transmitted to surface 108. Alternatively, raw measurements from bottom hole assembly 228 may be transmitted to surface 108.

Any suitable technique may be used for transmitting signals from bottom hole assembly 228 to surface 108, including, but not limited to, wired pipe telemetry, mud-pulse telemetry, acoustic telemetry, and electromagnetic telemetry. While not illustrated, bottom hole assembly 228 may include a telemetry subassembly that may transmit telemetry data to surface 108. Without limitation, an electromagnetic source in the telemetry subassembly may be operable to generate pressure pulses in the drilling fluid that propagate along the fluid stream to surface 108. At surface 108, pressure transducers (not shown) may convert the pressure signal into electrical signals for a digitizer (not illustrated). The digitizer may supply a digital form of the telemetry signals to information handling system 114 via a communication link 230, which may be a wired or wireless link. The telemetry data may be analyzed and processed by information handling system 114.

As illustrated, communication link 230 (which may be wired or wireless, for example) may be provided that may transmit data from bottom hole assembly 228 to an information handling system 114 at surface 108. Information handling system 114 may include a processing unit 116 (Referring to FIG. 1), a video display 120 (Referring to FIG. 1), an input device 118 (e.g., keyboard, mouse, etc.) (Referring to FIG. 1), and/or non-transitory computer-readable media 122 (e.g., optical disks, magnetic disks) (Referring to FIG. 1) that may store code representative of the methods described herein. In addition to, or in place of processing at surface 108, processing may occur downhole.

Figure 3:
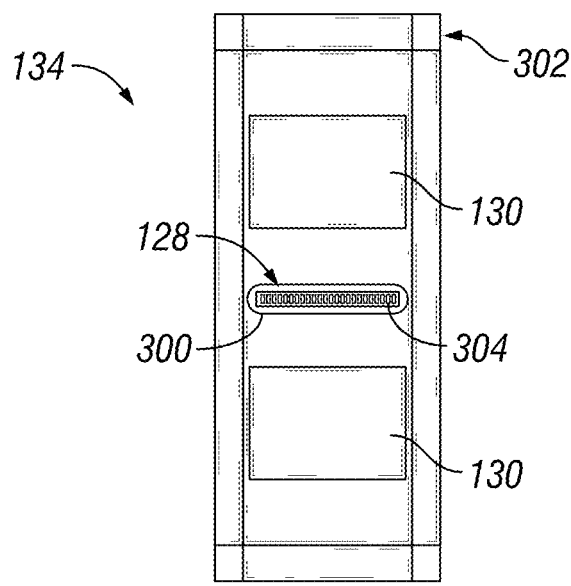
FIG. 3 illustrates an example of a pad.

FIG. 3 illustrates an example of pad 134. It should be noted that pad 134 may be connected to downhole tool 102 (e.g., referring to FIGS. 1 and 2). Pad 134 may serve to place button array 128 and/or return electrode 130 in contact with or in close proximity to borehole 124. Pad 134 may comprise a button array 128, a return electrode 130, a guard 300, and a housing 302. In examples, there may be a plurality of button arrays 128. In examples, return electrode 130 and button array 128 may be disposed directly on downhole tool 102. Button array 128 may comprise an injector electrode 304, wherein injector electrode 304 may be a sensor that senses impedance of formation 132. It should be noted that injector electrode 304 may be a button electrode. There may be any suitable number of injector electrodes 304 within button array 128 that may produce a desired, predetermined current. Without limitation, the range for a suitable number of injector electrodes 304 within button array 128 may be from about one injector electrode 304 to about one hundred injector electrodes 304. For example, the range for a suitable number of injector electrodes 304 within button array 128 may be from about one injector electrode 304 to about twenty-five injector electrodes 304, from about twenty-five injector electrodes 304 to about fifty injector electrodes 304, from about fifty injector electrodes 304 to about seventy-five injector electrodes 304, or from about seventy-five injector electrodes 304 to about one hundred injector electrodes 304.

In examples, there may be a plurality of return electrodes 130. One of the return electrodes 130 may be disposed on one side of button array 128, and another one of the return electrodes 130 may be disposed on the opposite side of button array 128. These return electrodes 130 may be disposed at equal distances away from button array 128 or at varying distances from button array 128. Without limitation, the distance from the center of one of the return electrodes to the button array may be from about one inch to about one foot. In examples, a voltage difference between button array 128 and return electrodes 130 may be applied, which may cause currents to be emitted from button array 128 into the mud (not illustrated) and formation 132 (referring to FIG. 1).

During operations, an operator may energize button array 128. A voltage may be applied between each injector electrode 304 and return electrode 130. The level of the voltage may be controlled by information handling system 114. This may cause currents to be transmitted through button array 128. These currents may travel through the mud and formation 132 and may reach back to return electrode 130. The amount of current emitted by each injector electrode 304 may be inversely proportional to the impedance seen by that injector electrode 304. This impedance may be affected by the properties of formation 132 and the mud directly in front of each injector electrode 304. Therefore, current emitted by each injector electrode 304 may be measured and recorded in order to obtain a formation image of the resistivity of formation 132.

In examples, a current may be transmitted from injector electrode 304 and return to return electrode 130. These two electrodes may be referred to as the current electrodes. Then, the voltage drop across button array 128 may be measured and used to estimate the impedance of formation 132. In these alternative implementations, injector electrodes 304 may be referred to as voltage electrodes or monitor electrodes. Proposed method may operate in any of the two designs above or any other similar oil based mud resistivity imager tool without any limitations. In the rest of the text, the imager tool will be assumed to be of the first design without any loss of generality.

Guard 300 may help to focus most of the current produced by button array 128 into formation 132 radially. Guard 300 may be disposed around button array 128. Guard 300 may include the same potential as button array 128.

In examples, housing 302 may serve to protect button array 128 and return electrodes 130 from the surrounding mud and formation 132. Housing may be made with any suitable material. Without limitation, suitable material may include metals, nonmetals, plastics, ceramics, composites and/or combinations thereof. In examples, housing 302 may be a metal plate. Housing 302 may be connected through arm 136 to downhole tool 102 (e.g., referring to FIG. 1). An insulating material may be used to fill the remaining portions of pad 134. In examples, ceramics may be used as the insulating material to fill the remaining portions of pad 134.

An impedance value may be calculated through the current transmitting between an injector electrode 304 and formation 132 for each injector electrode 304. The voltage between button array 128 and return electrodes 130 may be measured and divided by the transmitted current to produce a value for the impedance seen by each injector electrode 304. Most of the transmitted current may be returned to return electrodes 130 although some portions of it may return through housing 302 and downhole tool 102 (referring to FIG. 1).

Figure 4:
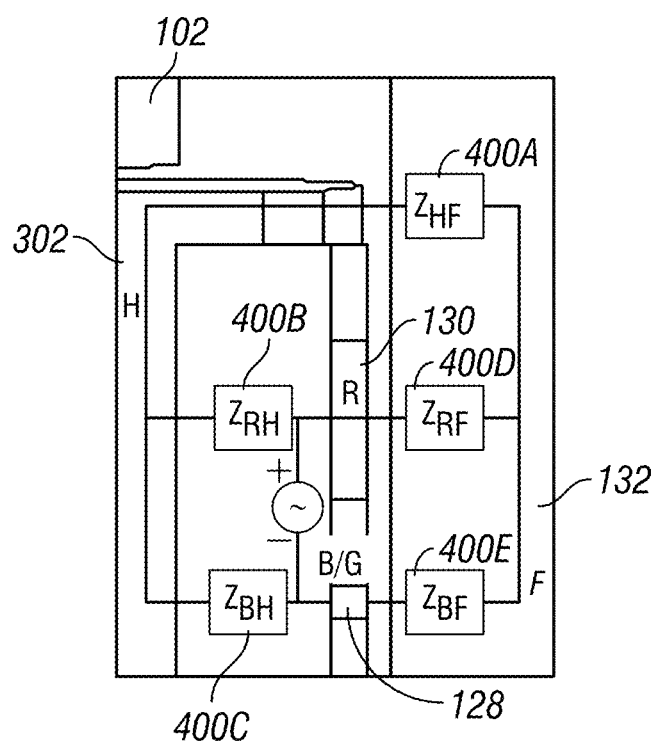
FIG. 4 illustrates an example of a circuit model of a downhole tool.

FIG. 4 illustrates an example of a circuit model that may approximate the downhole tool 102. Effects of the transmitted current may be approximately characterized by a housing-to-formation impedance value 400A, a return electrode-to-housing impedance value 400B, a return electrode-to-formation impedance value 400C, a button-to-housing impedance value 400D, and a button-to-formation impedance value 400E. Impedance may be calculated below, wherein Z is the impedance, $V_{BR}$ is the button to return electrode voltage and $I_B$ is the button current:

$$Z = \frac{V_{BR}}{I_B} \tag{1}$$

The value calculated in Equation (1) may be equal to $Z_{BF}+Z_{RF}$, as shown in FIG. 4, wherein $Z_{BF}$ is the impedance from an individual button of button array 128 to formation 132 and $Z_{RF}$ is the impedance of return electrode 130 to formation 132. It should be noted that impedances for each button of button array 128 may differ based on variations in borehole 124 such as the presence of rugosity, washouts, vugs in front of some of the buttons, and the environment. These variations in measured impedances, which may be illustrated in an impedance image, may be used to determine geophysical features. Additionally, both $Z_{BF}$ and $Z_{RF}$ have contributions from both the surrounding mud and formation 132 (referring to FIG. 1). Thus, equivalently it may be written in Equation (2) as:

$$Z \approx Z_{BF} = Z_{mud} + Z_F \qquad (2)$$

As a result, measured impedance may have contributions from both the mud and formation 132, wherein $Z_{mud}$ is the impedance of the mud and $Z_F$ is the impedance of formation 132. Imaginary parts of $Z_F$ and $Z^{mud}$ may be assumed to be mainly capacitive. Assuming this capacitance may be in parallel with the resistive portion, then $Z_{BF}$ may also be written as:

$$Z_{BF} = \frac{1}{\left(\frac{1}{R_M} + j\omega C_M\right)} + \frac{1}{\left(\frac{1}{R_F} + j\omega C_F\right)} \qquad (3)$$

wherein $R_M$ is the mud resistance, $R_F$ is the resistance of formation 132, $C_M$ is the mud capacitance, $C_F$ is the capacitance of formation 132, j is the unit imaginary number, and ω is the angular frequency. Both the mud resistance and mud capacitance may increase as standoff increases and may decrease with the increase in effective area of button array 128. "Standoff" may be used to denote the distance of the elements of a pad 134 from a wall of borehole 124 (e.g., Referring to FIG. 1). Standoff of each individual button in a button array may vary; standoffs of the return electrodes may differ from those of the buttons as well. Standoff variations will significantly affect button to formation impedance 400E. In the simplified circuit model, it is assumed that the standoff of each element of the pad is constant. Standoff may assume that pad 134 is movable while downhole tool 102 remains immobile. In examples, to achieve large distances from the wall of borehole 124, downhole tool 102 may be moved along with pad 134. In examples, the term "eccentricity" may be used instead of "standoff". The proposed methods (discussed further below) may be equally valid whether pad 134 moves or both pad 134 and downhole tool 102 move.

Figure 5:
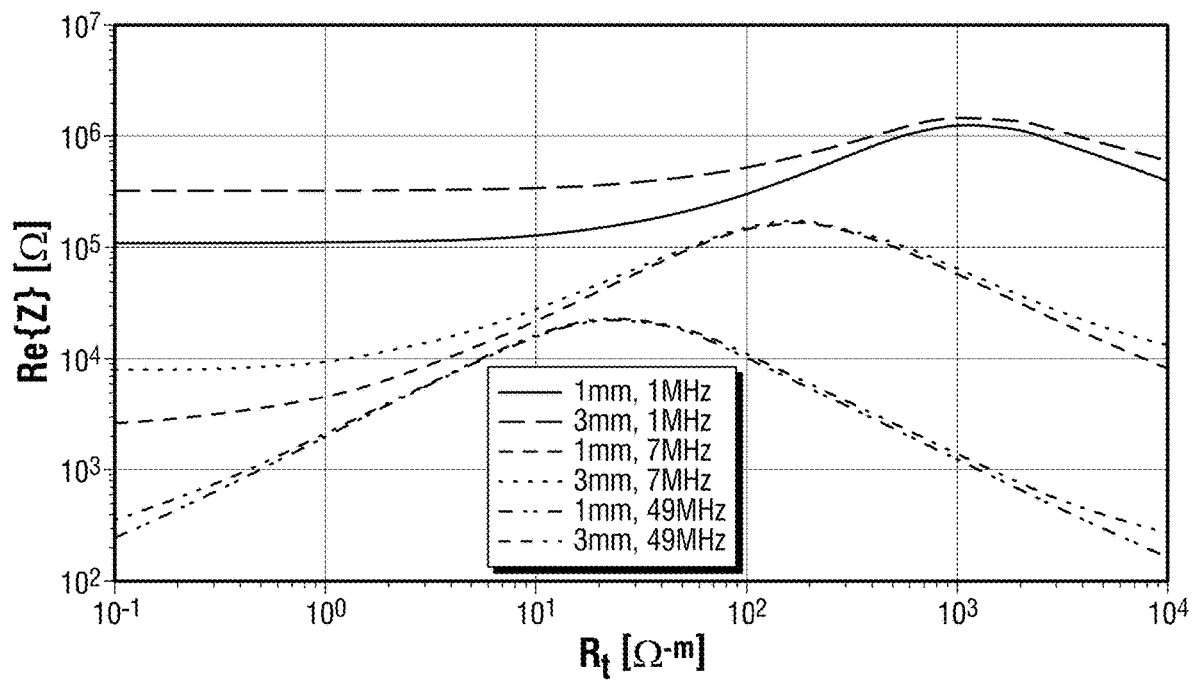
FIG. 5 illustrates a graph of the real part of the measured impedance versus the formation resistivity.

Equation (3) may be used to obtain basic performance curves for downhole tool 102. These basic performance curves may be fairly accurate in homogeneous formations 132 in determining the variation of the response of an exemplary injector electrode 304 in button array 128 (e.g., referring to FIGS. 1-3) with changing environmental parameters. In FIG. 5, the real part of the measured impedance versus the formation resistivity may be determined using Equation (3), which is illustrated on graph 500 in FIG. 5. The imaginary part of the impedance may be determined by the mud capacitance; therefore it may not be necessary to plot it. In an example, illustrated in FIG. 5, it may be assumed that formation permittivity (εF) is 15, mud permittivity (εM) is 6, and mud resistivity (ρM) is 8000 Ω-m. Results for three different frequencies (1 MHz, 7 MHz and 49 MHz) at two different standoffs (so=1 mm and so=3 mm), where (so) stands for standoff of the downhole tool 102 (e.g., referring to FIG. 1), may be displayed in FIG. 5.

As illustrated in FIG. 5, a separation between different standoffs at lower formation resistivities may be viewed. This effect may be more pronounced if the frequency is lower. At higher formation resistivities, the dielectric effect in formation 132 (e.g., referring to FIG. 1) may cause a roll-off in measured impedance, as illustrated in FIG. 5. Operating in a linear region of the curve, displayed in FIG. 5, may produce a more accurate correspondence between the impedance image and that of the true formation resistivity. The standoff effect at low formation resistivities may cause an ambiguity in the interpretation of the impedance images. These raw measurements may be used, but the contrast of the resistivity image may be reduced. Furthermore, small errors in standoff measurements may cause a large difference in the impedance reading. It may be observed from FIG. 5 that measured impedance may begin to decrease as the formation resistivity increases. This "rolloff" may be caused by the dielectric effects in formation 132 (e.g., referring to FIG. 1) and may become more pronounced at higher frequencies.

It is desirable to operate in a linear region of the curve to have a more accurate correspondence between the real part of the impedance image and that of the true formation resistivity. Standoff effect at low formation resistivities causes an ambiguity in the interpretation of the impedance images. Small errors in standoff measurements may cause a large difference in the impedance reading if these raw measurements may be used. By reducing the mud effect in the raw measurements, the response may become linear.

Figure 6:
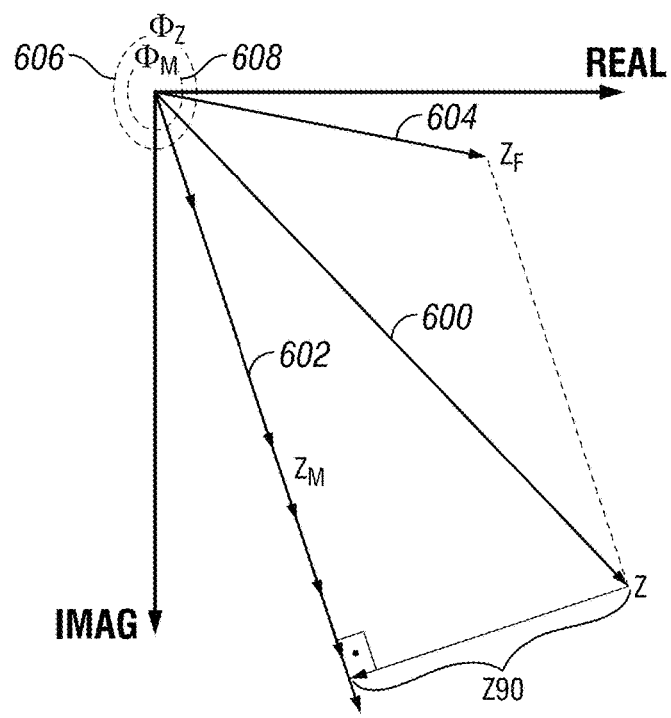
FIG. 6 illustrates an example of a Z90 processing algorithm.

In examples, a method may be used that makes use of data obtained at different frequencies to calculate the mud angle. The mud angle may be the phase angle of the impedance of the mud. In examples, the mud angle may be the arctangent of the ratio of the imaginary and the real parts of the complex impedance as it is commonly known by those skilled in the art. In examples, the mud angle will be different at each operating frequency. The mud angle may be used in mud removal schemes to eliminate the effect of the mud (or equivalently the standoff). Without limitations, an example of such a scheme may be the Z90 algorithm, as illustrated in FIG. 6. However, any other suitable mud removal scheme may be used in examples. The Z90 algorithm may be written in Equation (4) as:

$$Z90 = |Z|\sin(\varphi Z - \varphi M) \qquad (4)$$

The objective of Z90 processing may be to subtract the projection of the measured impedance on the mud impedance vector from the measured impedance to reduce the mud effect. As illustrated, measured impedance (Z), mud impedance (ZM), and formation impedance (ZF) may be represented as vector 600, vector 602, and vector 604 respectively, in the complex plane. Although the approximate direction of vector 602 may be known, its absolute strength depends on standoff among other factors. However, a projection of vector 600 onto vector 602 may be calculated accurately by measuring a phase angle of the measurement 606 and a phase angle of the mud 608. In equations, the phase angle of the measurement is defined as ($\varphi Z$) while ($\varphi M$) is the phase angle of the mud.

Figure 7:
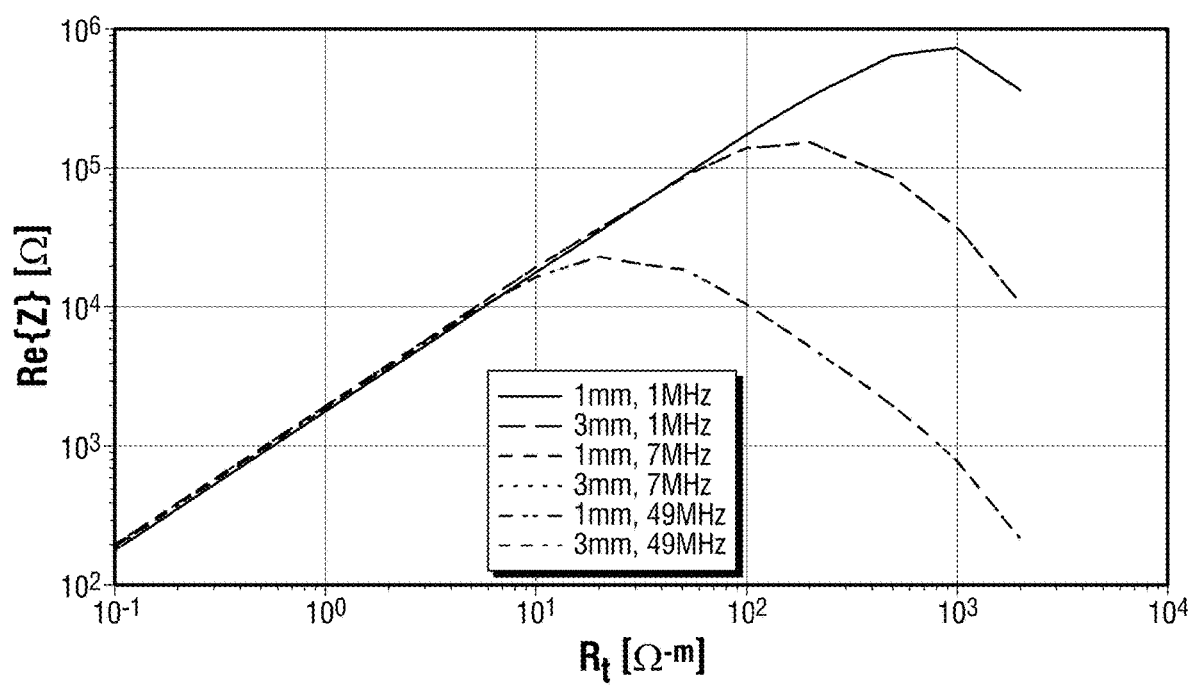
FIG. 7 illustrates an example of a graph after applying Z90 processing.

FIG. 7 illustrates a graph replotted after the application of the Z90 algorithm. As illustrated, the standoff effect may be eliminated for all frequencies utilized during data acquisition and/or processing. An ideal case using a perfect circuit model may occur where mud angle may be known and noise is not in the data, as depicted in FIG. 7. Concerning the present disclosure, without limitation, the proposed method below may be used with Z90 processing, but any other suitable processing or algorithms may be used.

Figure 8:
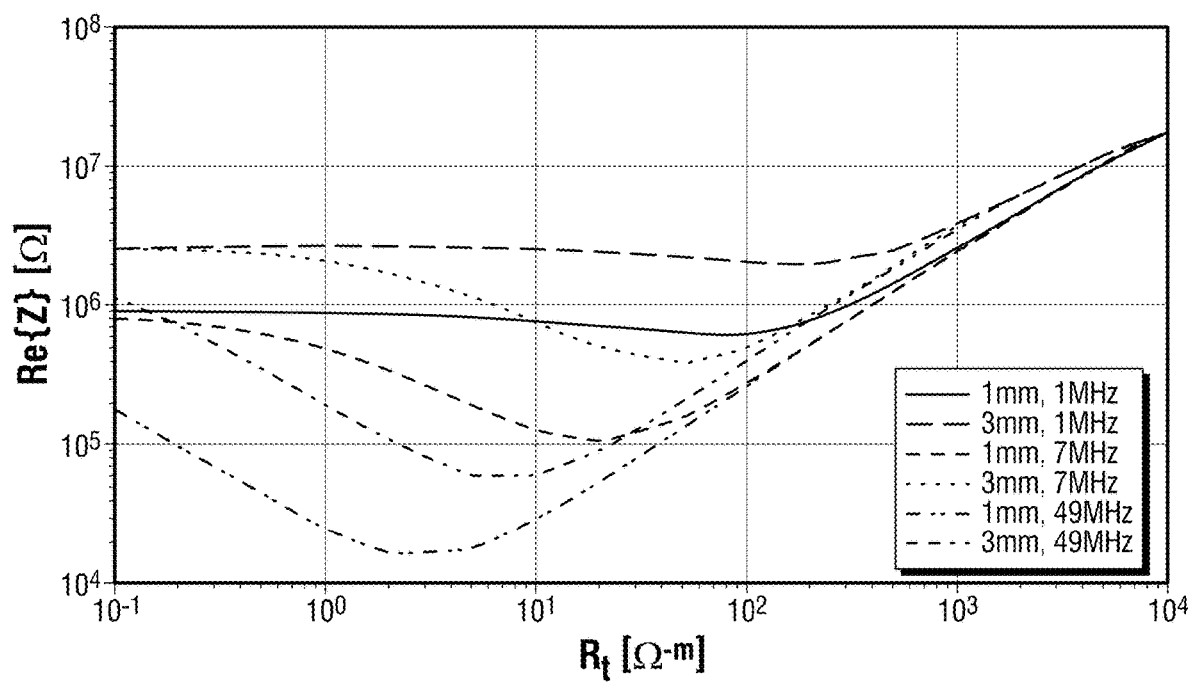
FIG. 8 illustrates an example of a graph after correcting for a dielectric effect.

As described previously and shown in FIG. 5, a factor affecting the linearity of the response may be the dielectric effect. The dielectric effect may become more pronounced as the formation resistivity and the operating frequency of downhole tool 102 (e.g., referring to FIG. 1) increases. For example, an alternate scheme may utilize a different processing scheme. In view of Equation (3), in cases where $Z_m \ll Z_f$, the equation may be altered as seen below:

$$Z_{BF} \approx \frac{R_F}{1 + h\omega R_F C_F} \tag{5}$$

$$\phi_Z \approx \tan^{-1}(-\omega R_F C_F) \tag{6}$$

$$\omega R_F C_F \approx -\tan(\phi_Z) \tag{7}$$

$$Z_{BF} \approx \frac{R_F}{1 - j\tan(\phi_Z)} \tag{8}$$

$$Z_{corr} = Z_{BF}(1 - j\tan(\phi_Z)) \tag{9}$$

where $Z_{corr}$ is defined as an impedance corrected for a dielectric effect. It should be noted that Equation (7) includes a multiplication of formation resistance and capacitance. Thus, the tangent of the phase angle of the measured impedance may be defined as the formation relaxation constant in analogy with the circuit systems. Equation (9) represents one of a variety of methods to apply the dielectric correction on recorded data from well measurement system 100. In FIG. 8, results when dielectric correction may be applied to recorded measurements from well measurement system 100 depicted in FIG. 5 are shown. It may be seen that the dielectric roll-off effect from FIG. 5 may be eliminated at high formation resistivities using this processing scheme. However, if mud resistivity is prevalent in measurements from well measurement system 100, results may deteriorate and becomes saturated. Additionally, there may be a small dependency on standoff which may be observed in high resistivity regions as well. The dependency may affect results of all the frequencies the same way, so it may not affect the blending algorithm as described below.

The proposed method may be based on the observation that dielectric correction and mud effect removal algorithms may be accurate in separate regions of the formation resistivity range. Typically, in regions where such algorithms may be utilized, mud effect removal algorithms may tend to give similar results at different frequencies. Thus, it is possible to switch between the results of a plurality of algorithms to obtain a blended output after comparing a variance over a frequency range of the original data, the processed results after applying a mud effect removal algorithm, and the processed results after applying a dielectric correction algorithm.

Figure 9:
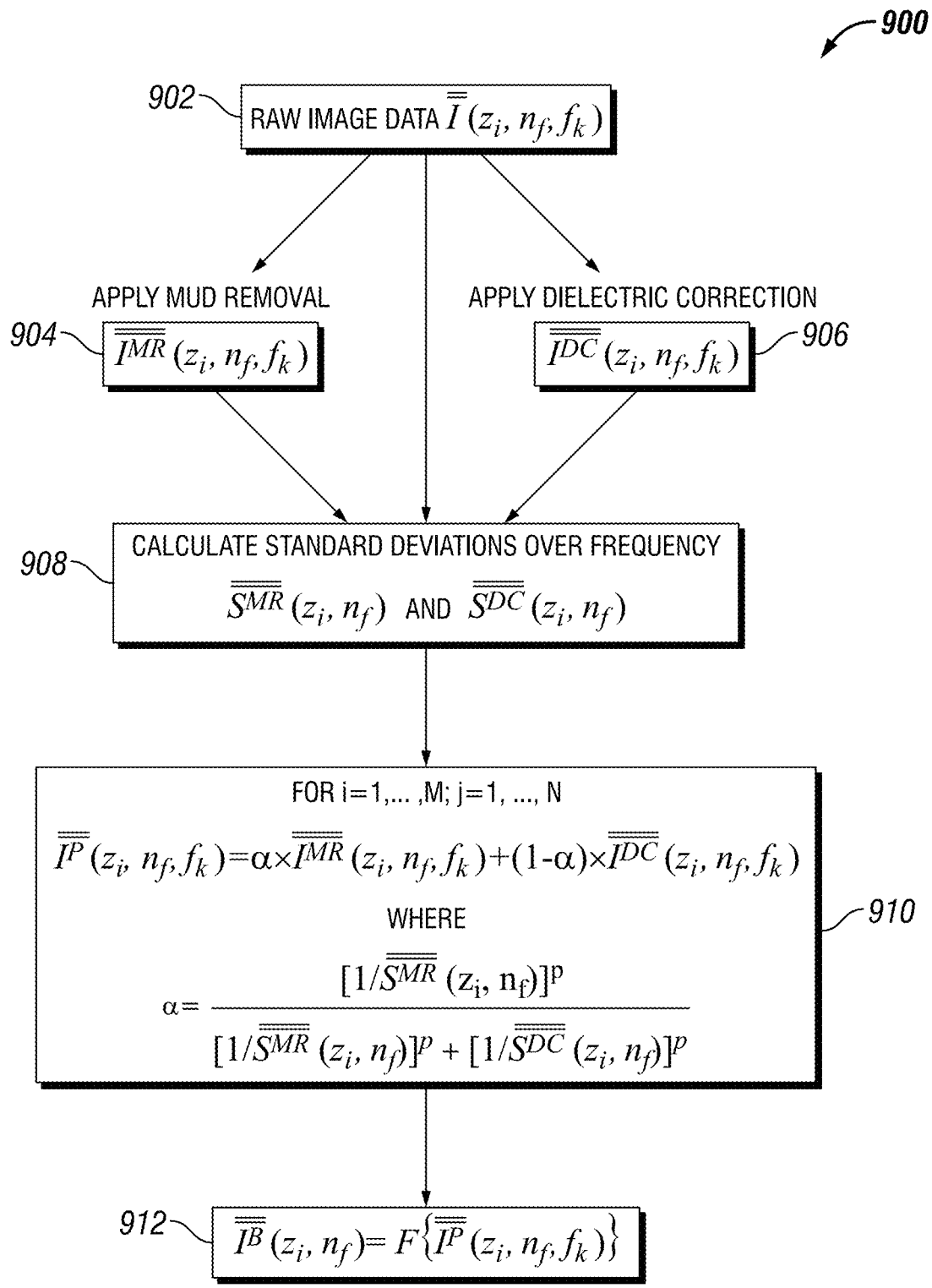
FIG. 9 illustrates an example of a flowchart.

FIG. 9 illustrates a flowchart 900 of the workflow of a proposed method with separate processes to obtain a blended output. In this workflow, initially a formation image of the formation surrounding the borehole, as defined in Equation (10) below:

$$\bar{\bar{I}}(z_i, n_j, f_k) \tag{10}$$

may be obtained using downhole tool 102 (e.g., referring to FIG. 1) in step 902. In examples, downhole tool 102 may obtain and/or process multi-frequency data measurements. It may be assumed that formation image ($\bar{\bar{I}}$) is a function of depth (z), azimuthal angle (n) and frequency (f.) In this example, double overbars are used to denote that data may be a matrix. Each element of the formation image that corresponds to a specific depth, azimuthal angle and frequency may be referred to as a pixel. The formation image may represent the impedance measured by downhole tool 102, or some other equivalent information such as the apparent resistivity.

Although only the real portion of this formation image matrix may be used to plot resistivity in most cases, the imaginary part of the data may be needed to apply mud removal and dielectric correction algorithms. In alternative examples, the formation image may be divided into several sections or zones. Alternatively, data for each logging point or image pixel may be processed separately in real time without any loss of generality. It may be further assumed in flowchart 900 that data samples for depth, azimuthal angle, and frequency are denoted by subscripts i, j, and k, respectively where there are a total of M depth samples, N azimuthal angle samples and K frequency samples. The formation image obtained in step 902 may be further processed in step 904 or step 906.

In step 904, a mud effect removal algorithm may be applied to the original formation image as outlined in step 902. In step 906, a dielectric correction algorithm may be applied to the original formation image as outlined in step 902. The results of these processes in step 904 and step 906 may be denoted by matrices in Equations (11) and (12).

$$\bar{\bar{I}}^{MR}(z_i, n_j, f_k) \tag{11}$$

$$\bar{\bar{I}}^{DC}(z_i, n_j, f_k) \tag{12}$$

As applied to Equation (10), the resulting formation images produced in step 904 ($\bar{\bar{I}}^{MR}$) and step 906 ($\bar{\bar{I}}^{DC}$) may be functions of depth, azimuthal angle, and frequency. In examples, these matrices may be purely real (i.e., no imaginary components). Once these results are obtained, step 908 may be implemented.

Step 908 may comprise of calculating a measure of the variations of the results over a frequency range. The measure may be a standard deviation of the results as shown in the Equations (13) and (14), represented as ($\bar{\bar{S}}^{MR}$) and ($\bar{\bar{S}}^{DC}$) for the standard deviations of the results produced in step 904 and step 906 respectively. In some examples, a measure of the variation of a function of the formation image may be calculated. In examples, this function may be a logarithm of the formation image values.

$$\bar{\bar{S}}^{MR}(z_i, n_j) \tag{13}$$

$$\bar{\bar{S}}^{DC}(z_i, n_j) \tag{14}$$

Afterwards, a weight may be calculated based on the calculated variations in step 910. Without limitation, any suitable weighting function may be used. In examples, one way to calculate the weight may be using Equation (15):

$$\alpha(zi, nj) = \frac{\left(1/\bar{\bar{S}}^{MR}(z_i, n_j)\right)^P}{\left(1/\bar{\bar{S}}^{MR}(z_i, n_j)\right)^P + \left(1/\bar{\bar{S}}^{DC}(z_i, n_j)\right)^P} \tag{15}$$

Here, weight ($\alpha$) is a ratio of the inverse of the standard deviation of the results after applying the mud removal algorithm in step 904 to the sum of the inverse of the standard deviations after applying the mud removal and dielectric correction algorithms in step 904 and step 906 respectively. Weight is a function of the depth and azimuthal angle, thus it may vary from pixel to pixel. A power (P) of the inverse of the standard deviations may be taken as well to obtain a sharper transition. (P) may be 2 or 3, for example, and may be optimized based on the specific design of the imaging tool. Using this weight, a processed formation image $\bar{\bar{I}}^P(z_i, n_j, f_k)$, as defined in Equation (16), may be calculated for each frequency.

$$\overline{I^P}(z_i, n_j, f_k) + \alpha(zi, nj) \times \overline{I^{MR}}(z_i, n_j, f_k) + (1-\alpha(zi, nj)) \times \overline{I^{DC}}(z_i, n_j, f_k) \quad (16)$$

It should be understood that equation (16) as well as any equation containing the indices i, j and k are performed for every possible value of these indices. Alternatively, the standard deviation of the formation image produced from step 902 may be calculated ($\overline{S^O}$) and incorporated into step 910. In examples, the additional factor may be useful in cases where the processed imaging results are not perfect (due to noise, inaccurate selection of processing parameters, etc.) In such a case, there may be regions of the processed formation image where the formation image from step 902 may be more accurate than either of the mud removal and dielectric corrected data. In such examples, Equations (15) and (16) may be modified as follows:

$$\alpha^{MR}(zi, nj) = \frac{\left(1/\overline{S^{MR}}(z_i, n_j)\right)^P}{\left(1/\overline{S^{MR}}(z_i, n_j)\right)^P + \left(1/\overline{S^{DC}}(z_i, n_j)\right)^P + \left(1/\overline{S^O}(z_i, n_j)\right)^P} \quad (17)$$

$$\alpha^{DC}(zi, nj) = \frac{\left(1/\overline{S^{DC}}(z_i, n_j)\right)^P}{\left(1/\overline{S^{MR}}(z_i, n_j)\right)^P + \left(1/\overline{S^{DC}}(z_i, n_j)\right)^P + \left(1/\overline{S^O}(z_i, n_j)\right)^P} \quad (18)$$

$$\alpha^O(zi, nj) = \frac{\left(1/\overline{S^O}(z_i, n_j)\right)^P}{\left(1/\overline{S^{MR}}(z_i, n_j)\right)^P + \left(1/\overline{S^{DC}}(z_i, n_j)\right)^P + \left(1/\overline{S^O}(z_i, n_j)\right)^P} \quad (19)$$

$$\overline{I^P}(z_i, n_j, f_k) = \alpha^{MR}(zi, nj) \times \overline{I^{MR}}(z_i, n_j, f_k) + \alpha^{DC}(zi, nj) \times \overline{I^{DC}}(z_i, n_j, f_k) + \alpha^O(zi, nj) \times \overline{I}(z_i, n_j, f_k) \quad (20)$$

After step 910, a concluding step 912 may end the workflow presented in flowchart 900. In step 912, a blended formation image, $\overline{I^B}(z_i, n_j)$, may be formed by taking a function of the weighted data. This function may involve any suitable mean, minimum, maximum and/or median operation. Additionally, in alternative examples, there may be a weight associated with a combination in step 912. This weight may be determined by, as an example, the absolute value of the measured impedance for each frequency (or one of the frequencies). In examples, a higher weight may be given to the highest frequency if the absolute value for that frequency is below a threshold based on the design of downhole tool 102.

$$\overline{I^B}(z_i, n_j) = F\{\overline{I^P}(z_i, n_j, f_k)\} \quad (21)$$

Although the blended formation image is obtained by obtaining a processed formation image in the preceding example, it may be obvious to one skilled in the art that Equations (16) and (20) need not be explicitly performed but may be implicit in the function definition of Equation (21). Without limitation, the blended formation image may be calculated directly without producing a processed formation image first.

Figure 10:
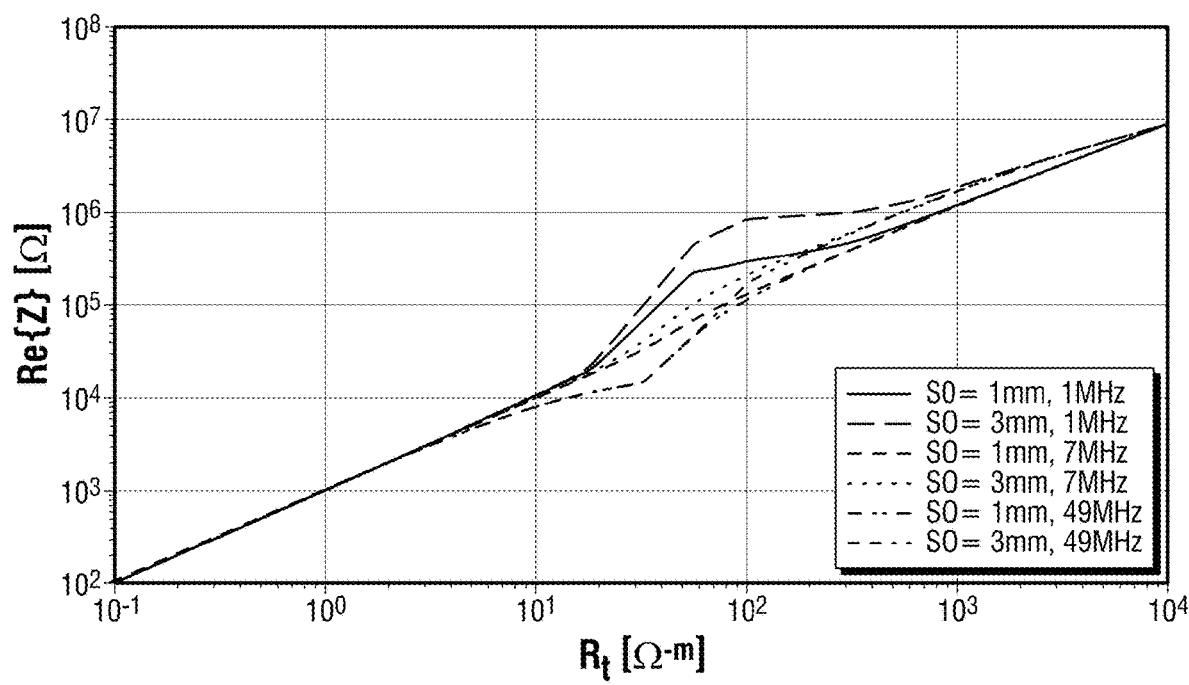
FIG. 10 illustrates an example of a graph of the blended processing.
Figure 11:
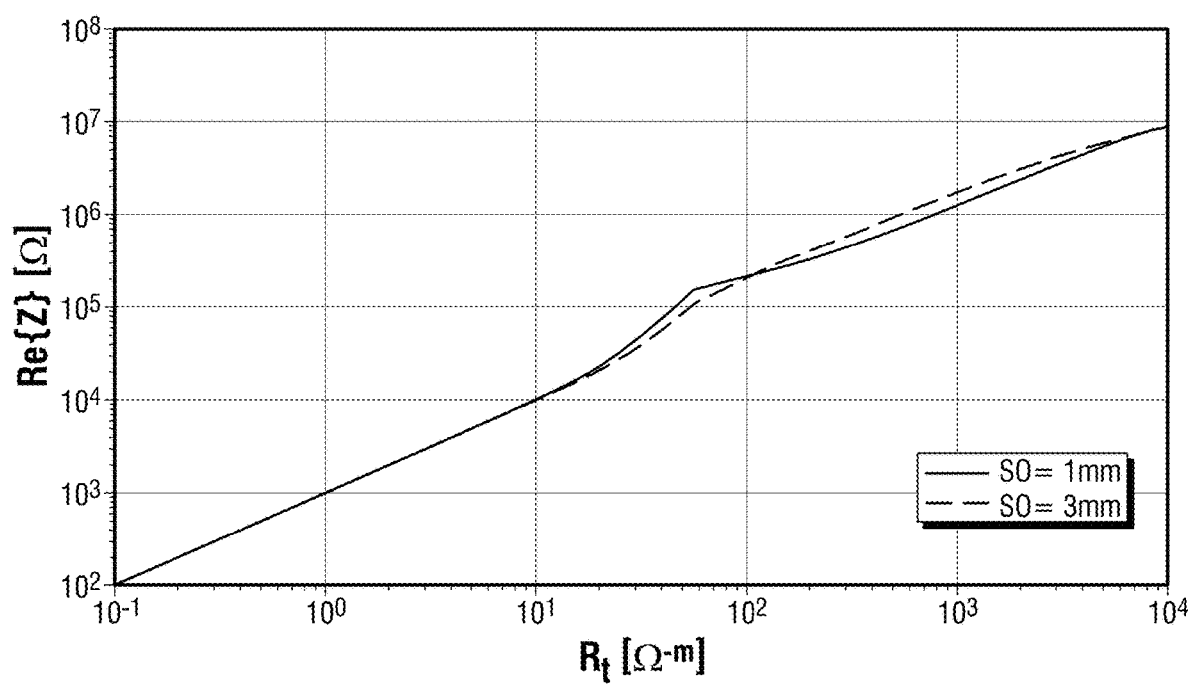
FIG. 11 illustrates an example of a graph of the blended processing.

FIGS. 10 and 11 show the results of the blending algorithm presented in flowchart 900 (e.g., referring to FIG. 9) for the data depicted in FIGS. 7 and 8. As illustrated, two different standoff values are shown at 1 mm and 3 mm. These two cases may be chosen to represent the performance in two different environments wherein they have been processed separately. Note that these plots show the application of the algorithms in two dimensional plots rather than color images, which illustrates the performance of the algorithm. In FIG. 10, intermediate processed results analogous to $\overline{I^P}$) for all the frequencies at 1 mm and 3 mm standoffs may be shown. It may be seen that individual frequency responses have improved. The results may be obtained assuming a power (P) of 3 during the processing in flowchart 900.

In FIG. 11, the final blended results (analogous to $\overline{I^B}$) may be shown at two different standoff values. In examples, the median of the processed results for the three frequencies may be selected to produce the final blended formation image. The results may be monotonically increasing and vary linearly with the formation resistivity. Thus, a good estimation of the formation resistivity may be obtained by scaling the impedance with a constant of downhole tool 102 (e.g., referring to FIG. 1). As illustrated, formation image quality may be greatly enhanced as a result of applying the methods of the present disclosure.

Figure 12:
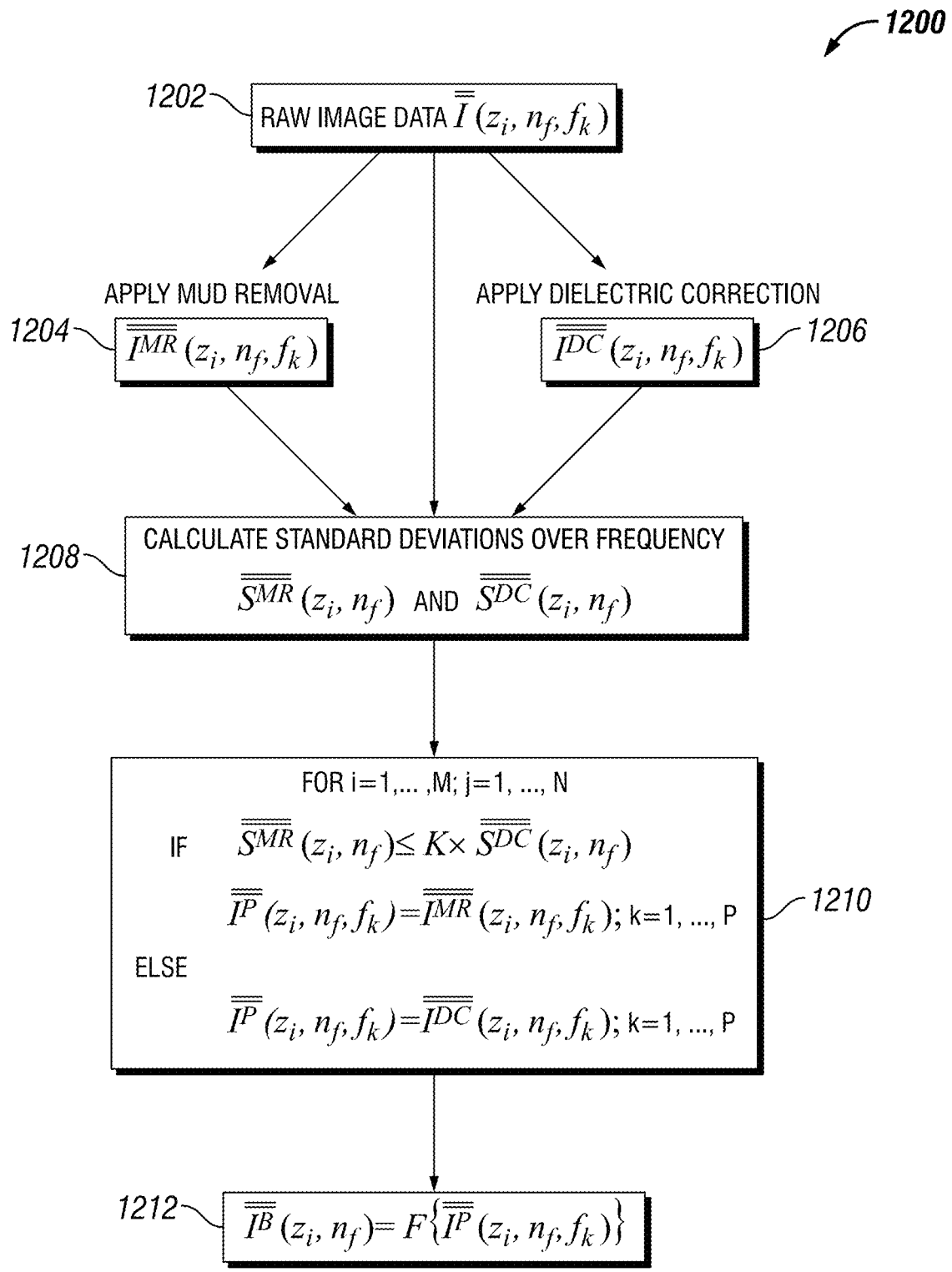
FIG. 12 illustrates an example of a flowchart.

In an alternate example, instead of a continuous transition as depicted in flowchart 900 of FIG. 9, a switching algorithm may be implemented as illustrated in FIG. 12. It should be noted that a switching algorithm may also be considered as a weighted average with weights of 1 for a pixel from one of the formation images (such as a pixel from $\overline{I^{MR}}(z_i, n_j, f_k)$) and 0 for the other formation images for that specific pixel (such as $\overline{I^{DC}}(z_i, n_j, f_k)$ and $\overline{I}(z_i, n_j, f_k)$). Flowchart 1200 may provide the workflow for an alternate embodiment starting with a step 1202. Step 1202 may be similar to step 902 (e.g., referring to FIG. 9) in flowchart 900 in that an initial formation image of the surrounding formation near a borehole is obtained. Further step 1204 or step 1206 may be implemented to process the data in the initial formation image with a mud removal algorithm or a dielectric correction algorithm, respectively. Then, step 1208 may be implemented to calculate a measure of the variations of the results over a frequency range. The measurement may be a standard deviation of the results as shown in the Equations (13) and (14), represented as ($\overline{S^{MR}}$) and ($\overline{S^{DC}}$) for the standard deviations of the results produced in step 1204 and step 1206 respectively. Alternatively, the standard deviation of the original formation image produced from step 1202) ($\overline{S^O}$) may be calculated as well.

After step 1208, step 1210 may be implemented. In this example, when the standard deviation after mud removal is less than the standard deviation after dielectric correction for a specific pixel corresponding to ($z_i$, $n_j$), the mud removal algorithm results may be used for further processing for that pixel. Alternatively, if the standard deviation after mud removal is greater than the standard deviation after dielectric correction, the dielectric correction results may be used for further processing for that pixel. A scaling factor of K may be added to the switching algorithm, as in Equations (22) and Equation (23), to further optimize the switching between the two algorithms. Factor K may be dependent on frequency and/or downhole tool 102 (e.g., referring to FIG. 1). Factor K may be determined empirically. For the example shown in flowchart 1200, a K value of around 2 may be chosen, wherein K may be optimized based on the specific design of the downhole tool 102.

$$\overline{S^{MR}}(z_i, n_j) \leq K \times \overline{S^{DC}}(z_i, n_j) \rightarrow \overline{I^P}(z_i, n_j, f_k) = \overline{I^{MR}}(z_i, n_j, f_k);$$
$$k=1, \ldots, P \quad (22)$$

$$\overline{S^{MR}}(z_i, n_j) > K \times \overline{S^{DC}}(z_i, n_j) \rightarrow \overline{I^P}(z_i, n_j, f_k) = \overline{I^{DC}}(z_i, n_j, f_k);$$
$$k=1, \ldots, P \quad (23)$$

After step 1210, a concluding step 1212 may end the workflow presented in flowchart 1200. In step 1212, a blended formation image, $\overline{I^B}(z_i, n_j)$ may be formed by taking a function of the weighted data. This function may involve any suitable mean, minimum, maximum, and/or median operation. Additionally, in alternative examples, there may be a weight associated with a combination in step 1212. This weight may be determined by, as an example, the absolute value of the measured impedance for each frequency (or one of the frequencies). In examples, a higher weight may be given to the highest frequency if the absolute value for that frequency is below a threshold based on the design of downhole tool 102.

In another alternative example, some form of the original data (i.e. without any dielectric correction or mud removal algorithms applied) such as its real part, imaginary part, or absolute value may be used in conjunction with mud removal and dielectric correction algorithms during blending. One such example may be by using the real part of the original data with the lowest frequency value in regions where both mud removal and dielectric correction may be deemed inaccurate. Such a region may be determined by looking at the variations of both the mud removal and dielectric correction algorithms, as depicted in flowchart 1300 of FIG. 13.

Figure 13:
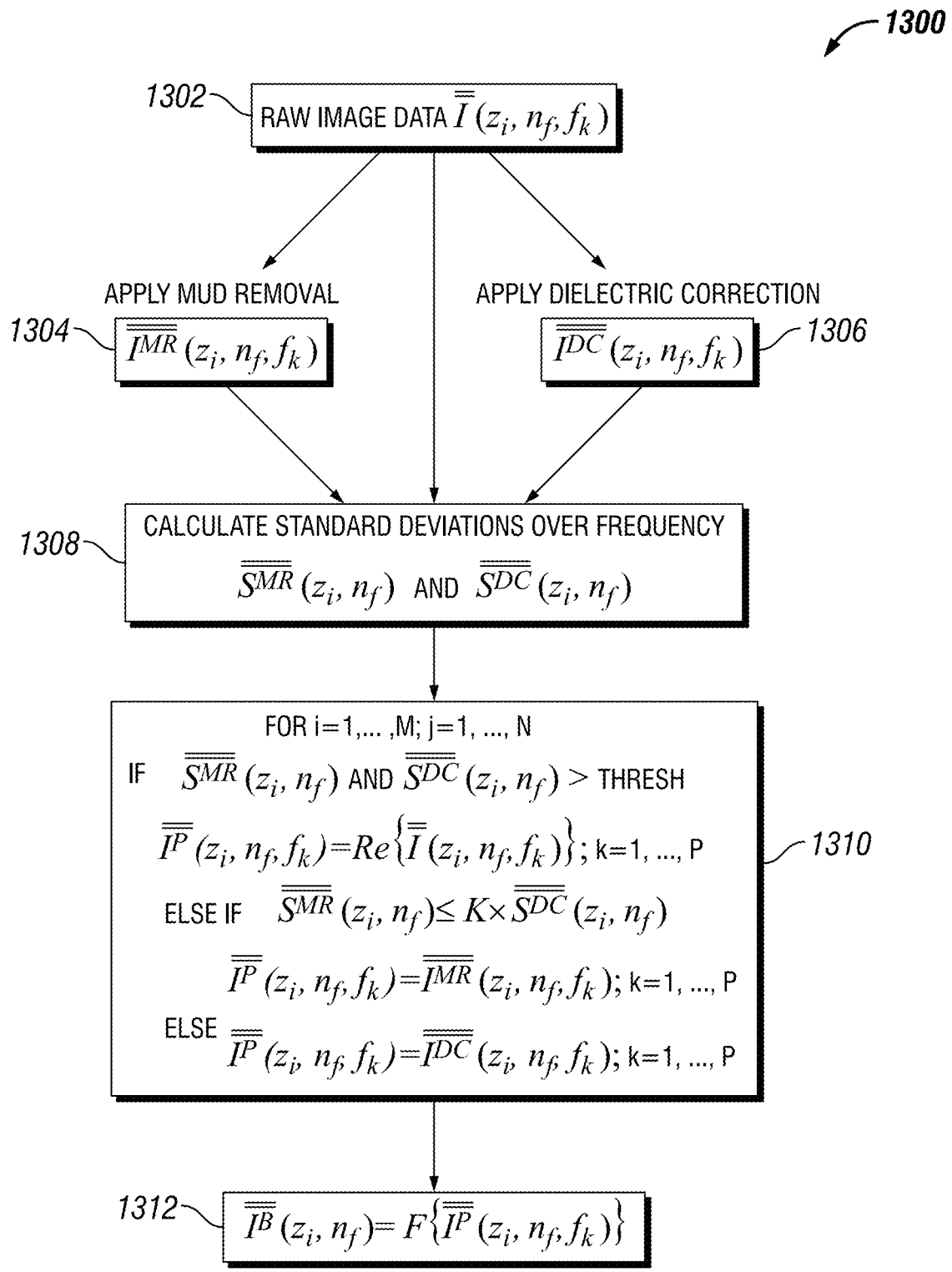
FIG. 13 illustrates an example of a flowchart.

FIG. 13 illustrates a flowchart 1300 of the workflow of a proposed method. Flowchart 1300 may provide the workflow for an alternate embodiment starting with a step 1302. Step 1302 may be similar to step 902 (e.g., referring to FIG. 9) in flowchart 900 in that an initial formation image of the surrounding formation near a borehole is obtained. Further, step 1304 or step 1306 may be implemented to process the data in the initial formation image with a mud removal algorithm or a dielectric correction algorithm, respectively. Then, step 1308 may be implemented to calculate a measure of the variations of the results over a frequency range. The measure may be a standard deviation of the results as shown in the Equations (13) and (14), represented as ($\overline{S}^{MR}$) and ($\overline{S}^{DC}$) for the standard deviations of the results produced in step 1304 and step 1306 respectively. Alternatively, the standard deviation of the original formation image produced from step 1302 may be calculated.

After step 1308, step 1310 may be implemented. In this example, if the standard deviations of the results over the frequency range after mud removal and dielectric correction algorithms are over a threshold (Thresh), the real part of the lowest frequency in its original form may be used, as illustrated in Equation (24).

$$\overline{S^{MR}}(z_i, n_j) > \text{Thresh} \ \& \ \overline{S^{DC}}(z_i, n_j) > \text{Thresh} \rightarrow \overline{I^P}(z_i, n_j, f_k) = \text{Re}\{I(z_i, n_j, f_1)\}; k=1, \ldots, P \quad (24)$$

It is assumed that $f_1$ contains the lowest frequency in the workflow in Equation (24). The rest of the processing may follow the methodologies described above, such as the one described in FIG. 9 or 12. Alternatively, the signal value without any correction may be used for this determination. For example, the absolute value of the impedance or resistivity obtained from the highest frequency may be used for this purpose. If the standard deviations of the results over the frequency range after mud removal and dielectric correction algorithms are not over a threshold (Thresh), Equations (22) and (23) may be used to determine the intermediate processed results (i.e., $\overline{I^P}$). In other examples, Thresh, as shown in Equation (24), may be a function of $\overline{S^O}$.

After step 1310, a concluding step 1312 may end the workflow presented in flowchart 1300. In step 1312, a blended formation image, $\overline{I^B} = (z_i, n_j)$ may be formed by taking a function of the weighted data. This function may involve any suitable mean, minimum, maximum and/or median operation. Additionally, in alternative examples, there may be a weight associated with a combination in step 1312. This weight may be determined by, as an example, the absolute value of the measured impedance for each frequency (or one of the frequencies). In examples, a higher weight may be given to the highest frequency if the absolute value for that frequency is below a threshold based on the design of downhole tool 102 (e.g., Referring to FIG. 1).

In examples, as described above, final blending function may use a weighting between different frequencies, or there may be a switching between frequencies based on a threshold. This threshold may be based on the absolute value of the signal at a certain frequency. FIG. 14 illustrates an example blending function 1400 that may be used in such an implementation. In this example, as shown in Equations (25) and (26), if the absolute value of the highest frequency (assumed to be frequency P) is lower than a threshold, a blending function (F) may use the processed results from the highest frequency. Otherwise, a median function may be used. Such an example may be desirable in formations with thin, resistive layers which may be resolved better with higher frequencies.

$$|\overline{I}(z_i, n_j, f_P)| < \text{Thresh} \rightarrow F\{\overline{I^P}(z_i, n_j, f_k)\} = \overline{I^P}(z_i, n_j, f_P) \quad (25)$$

$$F\{\overline{I^P}(z_i, n_j, f_k)\} = \text{median}\{\overline{I^P}(z_i, n_j, f_k)\} \text{ over } f \text{ o.w.} \quad (26)$$

In other examples, results of the proposed methods may be inspected by an operator and may be used as a starting point in the creation of a manually blended formation image. In examples, an operator may be defined as an individual, group of individuals, or an organization. To further show the improvement produced by the suggested methods, a synthetic formation image data was simulated using a 3D FEM based electromagnetics solver at three different frequencies, a low, a medium and a high frequency, for a formation resistivity profile as shown in Table 1.

TABLE 1

| Resistivity [Ω · m] | Upper bound [inch] |
| --- | --- |
| 1000 | ~∞ |
| 100 | 21.1 |
| 10000 | 16.5 |
| 6 | 15.3 |
| 3 | 14.2 |
| 10 | 13.0 |
| 0.6 | 12.4 |
| 0.1 | 11.3 |
| 0.3 | 10.1 |
| 2 | 9.5 |
| 1 | 4.9 |

Formation relative permittivity is taken as 15 and standoff is 1 mm. The boundaries in this table may be given for the azimuth angle of 180° as the reference. Formation dip angle was 30°. In FIGS. 15(*a*) through 15(*c*), formation images of apparent resistivity measured at these three frequencies may be depicted. A color-map is illustrated on the right side of each of the figures. In examples, darker colors may represent lower formation resistivities while the lighter colors may represent higher formation resistivities. The vertical lines may denote that there is no data in that part of the formation image. As expected from the previous discussions, a low frequency image may not be sensitive to the layers with low formation resistivity. Alternatively, dielectric roll-off effect may be more pronounced at higher frequencies.

FIG. 16 illustrates a blended formation image as a result of the proposed methods in the present disclosure. It may be observed that the final blended formation image shows a much better correlation with the real formation resistivity compared to the formation images obtained from the original data in FIGS. 15(a) through 15(c). Furthermore, the blended formation image may show a better contrast of the formation layers. Obtaining such an accurate formation image automatically and with little computational effort may allow a quick and accurate interpretation of the formation properties by an operator. In examples, the results may be further improved by scaling the results of the processing functions with a constant of downhole tool 102 (e.g., Referring to FIG. 1) if the algorithms cause a shift in impedance and/or resistivity values.

Currently, problems exist with impedance images obtained by oil based mud imagers due to characteristics that degrade the formation image quality. For example, when the formation resistivity is low and operating frequency is relatively low, a significant mud effect may be observed. On the other hand, at high formation resistivities, dielectric effect causes a rolloff in the measured impedance. This later effect is more pronounced at higher operating frequencies. In examples, this effect may be observed at resistivities lower than 2 Ω-m for frequencies around 50 MHz, while the resistivities as high as 100 Ω-m may be affected if the frequency is lowered to 1 MHz. This effect may be a function of formation dielectric constant (e.g., the effect increases with an increasing dielectric constant). For a typical formation dielectric constant of around 15, roll-off may begin for resistivities above 1000 Ω-m at 1 MHz, while for frequencies around 50 MHz roll-off may be observed at resistivities above 20 Ω-m.

As disclosed above, a real-time processing technique that automatically combines the corrections made for these two effects and creates a single formation image from the multi-frequency data improves current technology by combining two techniques into a single process. In examples, the proposed technique combines the results of a mud effect removal algorithm, along with the results of a dielectric correction algorithm to obtain a more accurate formation image of the formation surrounding the borehole over a wide range of formation parameters. The improvement over current technology is based on information that the regions where the mud effect is prevalent, results obtained after mud effect removal at different operating frequencies should be close to each other. Similarly, in the regions where dielectric correction is accurate, processed results at different frequencies should match each other. Thus, it is possible to combine the results of two such algorithms based on their frequency variations.

As disclosed above, improvements may include, a processed formation image that removes both the mud effect as well as the dielectric effect, using multifrequency data with a mud effect removal algorithm and dielectric effect correction separately, and combinations are based on the variation of the results over frequency. Thus, an accurate formation image of the formation may be produce in real time, which may not be possible with an inversion scheme. The method is therefore more accurate than using raw data and less computationally intensive than an inversion scheme.

Improvements increases the quality of the formation images obtained with oil based mud imagers through processing. In particular, it provides a formation image with improved contrast in both low and high resistivity formations where traditionally oil based mud imagers perform poorly. The methods disclosed above may be performed in real time while giving comparable formation image quality to the ones obtained by much more computationally intensive methods such as inversion. Without limitation, an algorithm may be used in place of manual selection of results at different frequencies choosing the most accurate in each case or may aid as a starting point in such a determination, saving time and money.

Accordingly, a system and method for correcting for a dielectric effect and obtaining an accurate resistivity estimate from a downhole device may be provided. The systems and methods disclosed herein may include any of the various features of the systems and methods disclosed herein, including one or more of the following statements.

Statement 1: A method of resistivity imaging, comprising: disposing a downhole tool into a borehole, wherein the downhole tool comprises: a pad; an array of injector electrodes; and one or more return electrodes; applying a voltage difference between the array of injector electrodes and the one or more return electrodes with a plurality of frequencies; making an impedance measurement with the array of injector electrodes for each of the plurality of frequencies; constructing a first set of formation images for each of the plurality of frequencies; applying a mud effect removal algorithm to produce a second set of formation images for each of the plurality of frequencies; applying a dielectric correction algorithm to each of the plurality of frequencies to produce a third set of formation images for each of the plurality of frequencies; and combining the first set of formation images, the second set of formation images, and the third set of formation images to obtain a blended image.

Statement 2: The method of statement 1, wherein only two of the first set of formation images, the second set of formation images, and the third set of formation images are used in blending.

Statement 3: The method of any of the preceding statements, wherein the blended image is formed based on a variation of first, second and third sets of images with frequency and wherein the variation is determined by taking a standard deviation of each pixel in the first set of formation images, the second set of formation images, and the third set of formation images over the plurality of frequencies for each set.

Statement 4: The method of any of the preceding statements, further comprising applying a weighting function to each pixel of each of the first set of formation images, the second set of formation images, and the third set of formation images with weights that are inversely proportional to the standard deviation of each pixel to produce the blended image.

Statement 5: The method of any of the preceding statements, wherein a switching algorithm is applied by setting the weights of any or all of the first set of formation images, the second set of formation images, and the third set of formation images to be zero for any pixel of the first set of formation images, the second set of formation images, or the third set of formation images.

Statement 6: The method of any of the preceding statements, wherein the weighting function uses scaled versions of a standard deviations of the first set of formation images, the second set of formation images, or the third set of formation images.

Statement 7: The method of any of the preceding statements, wherein a scaling factor is dependent on frequency, a design of the downhole tool, or is determined empirically.

Statement 8: The method of any of the preceding statements, further comprising producing a processed image for each of the plurality of frequencies by combining the first set of formation images, the second set of formation images, and the third set of formation images for a specific frequency.

Statement 9: The method of any of the preceding statements, further comprising applying a weighting function to each pixel of the processed image corresponding to the specific frequency in the first set of formation images, the second set of formation images, and the third set of formation images with weights that are inversely proportional to their standard deviations.

Statement 10: The method of any of the preceding statements, further comprising obtaining the blended image from the processed image for each of the plurality of frequencies through a weighted averaging, a median selection, a minimum selection, or a maximum selection operation.

Statement 11: The method of any of the preceding statements, further comprising designating a threshold, wherein real components of a pixel of the first set of formation images are designated as the pixel of the processed image if a standard deviation of both the second set of formation images and the third set of formation images are greater than the threshold for that specific pixel, and wherein the blended image is produced from a function of the processed image.

Statement 12: The method of any of the preceding statements, wherein the threshold is based on the absolute value of the multi-frequency impedance measurement at a certain frequency.

Statement 13: A system for resistivity imaging, comprising: a downhole tool, wherein the downhole tool comprises: a pad, an array of injector electrodes; and one or more return electrodes; a conveyance for disposing the downhole tool in a borehole; and an information handling system, wherein the information handling system is configured to measure an impedance for each of a plurality of frequencies and construct a first set of formation images from each impedance for each of the plurality of frequencies; apply a mud effect removal algorithm to produce a second set of formation images; apply a dielectric correction algorithm to produce a third set of formation images for each of the plurality of frequencies; and combine the first set of formation images, the second set of formation images, and the third set of formation images to obtain a blended image.

Statement 14: The system of statement 13, wherein the information handling system is configured to calculate a standard deviation for a variation over frequency of each pixel from the first set of formation images, the second set of formation images, and the third set of formation images.

Statement 15: The system of statement 13 or 14, wherein the information handling system is further configured to apply a weighting function to each pixel of the first set of formation images, the second set of formation images, and the third set of formation images with weights that are inversely proportional to their standard deviations to produce the blended image.

Statement 16: The system of any one of statements 13 to 15, wherein the information handling system is further configured to use only two of the first set of formation images, the second set of formation images, and the third set of formation images in blending.

Statement 17: The system of any one of statements 13 to 16, wherein the information handling system is configured to produce a processed image for each of the plurality of the frequencies by combining the images from the first set of formation images, the second set of formation images, and the third set of formation images for a specific frequency using the variation of very pixel in each image set over frequency.

Statement 18: The system of any one of statements 13 to 17, wherein the information handling system is configured to produce the blended image from the processed images through a weighted averaging, a median selection, a minimum selection, or a maximum selection operation.

Statement 19: The system of any one of statements 13 to 18, wherein the information handling system is configured to designate a threshold, wherein real components of a pixel of the first set of formation images are designated as a processed image if the standard deviations of both the second set of formation images, and the third set of formation images for that specific pixel are greater than the threshold, wherein a blended image is produced from a function of the processed image.

Statement 20: The system of any one of statements 13 to 19, wherein the threshold is based on the absolute value of the multi-frequency impedance measurement at a certain frequency.

Although the present invention and its advantages have been described in detail, it should be understood that various changes, substitutions and alterations may be made herein without departing from the spirit and scope of the invention as defined by the appended claims. The preceding description provides various examples of the systems and methods of use disclosed herein which may contain different method steps and alternative combinations of components. It should be understood that, although individual examples may be discussed herein, the present disclosure covers all combinations of the disclosed examples, including, without limitation, the different component combinations, method step combinations, and properties of the system. It should be understood that the compositions and methods are described in terms of "comprising," "containing," or "including" various components or steps, the compositions and methods can also "consist essentially of" or "consist of" the various components and steps. Moreover, the indefinite articles "a" or "an," as used in the claims, are defined herein to mean one or more than one of the element that it introduces.

For the sake of brevity, only certain ranges are explicitly disclosed herein. However, ranges from any lower limit may be combined with any upper limit to recite a range not explicitly recited, as well as, ranges from any lower limit may be combined with any other lower limit to recite a range not explicitly recited, in the same way, ranges from any upper limit may be combined with any other upper limit to recite a range not explicitly recited. Additionally, whenever a numerical range with a lower limit and an upper limit is disclosed, any number and any included range falling within the range are specifically disclosed. In particular, every range of values (of the form, "from about a to about b," or, equivalently, "from approximately a to b," or, equivalently, "from approximately a-b") disclosed herein is to be understood to set forth every number and range encompassed within the broader range of values even if not explicitly recited. Thus, every point or individual value may serve as its own lower or upper limit combined with any other point or individual value or any other lower or upper limit, to recite a range not explicitly recited.

Therefore, the present examples are well adapted to attain the ends and advantages mentioned as well as those that are inherent therein. The particular examples disclosed above are illustrative only, and may be modified and practiced in different but equivalent manners apparent to those skilled in the art having the benefit of the teachings herein. Although individual examples are discussed, the disclosure covers all combinations of all of the examples. Furthermore, no limitations are intended to the details of construction or design herein shown, other than as described in the claims below. Also, the terms in the claims have their plain, ordinary meaning unless otherwise explicitly and clearly defined by the patentee. It is therefore evident that the particular illustrative examples disclosed above may be altered or modified and all such variations are considered within the scope and spirit of those examples. If there is any conflict in the usages of a word or term in this specification and one or more patent(s) or other documents that may be incorporated herein by reference, the definitions that are consistent with this specification should be adopted.

What is claimed is:

1. A method of resistivity imaging, comprising:
disposing a downhole tool into a borehole, wherein the downhole tool comprises:
a pad;
an array of injector electrodes; and
one or more return electrodes;
applying a voltage difference between the array of injector electrodes and the one or more return electrodes with a plurality of frequencies;
making an impedance measurement with the array of injector electrodes for each of the plurality of frequencies;
constructing a first set of formation images and a second set of formation images from the impedance measurement;
combining the first set of formation images and the second set of formation images to form a blended image, wherein at least one or more pixels from the blended image are different than 0, wherein at least one or more pixels from the blended image are different than every pixel from the first set of formation images, and wherein at least one or more pixels from the blended image are different than every pixel from the second set of formation images.

2. The method of claim 1, further comprising applying a mud effect removal algorithm to the first set of formation images to form the second set of formation images.

3. The method of claim 2, further comprising applying a dielectric correction algorithm to each of the plurality of frequencies to produce a third set of formation images.

4. The method of claim 1, further comprising applying a weighting function to each pixel of each of the first set of formation images and the second set of formation images.

5. The method of claim 4, wherein a switching algorithm is applied by setting the weights of any or all of the first set of formation images and the second set of formation images to be zero for any pixel of the first set of formation images and the second set of formation images.

6. The method of claim 4, wherein the weighting function uses a scaling factor.

7. The method of claim 6, wherein a scaling factor is dependent on frequency, a design of the downhole tool, or is determined empirically.

8. The method of claim 1, further comprising producing a processed image for each of the plurality of frequencies by combining the first set of formation images and the second set of formation images for a specific frequency.

9. The method of claim 8, further comprising applying a weighting function to each pixel of the processsed image corresponding to the specific frequency in the first set of formation images and the second set of formation images.

10. The method of claim 1, wherein the blended image is formed using a weighted averaging, a median selection, a minimum selection, or a maximum selection operation.

11. A system for resistivity imaging, comprising:
a downhole tool, wherein the downhole tool comprises:
a pad
an array of injector electrodes; and
one or more return electrodes configured to take an impedance measurement for each of a plurality of frequencies;
a conveyance for disposing the downhole tool in a borehole; and
an information handling system, wherein the information handling system is configured to:
construct a first set of formation images and a second set of formation images from the impedance measurement;
combine the first set of formation images and the second set of formation images to form a blended image, wherein at least one or more pixels from the blended image are different than 0, wherein at least one or more pixels from the blended image are different than every pixel from the first set of formation images, and wherein at least one or more pixels from the blended image are different than every pixel from the second set of formation images.

12. The system of claim 11, wherein the information handling system is configured to apply a mud effect removal algorithm to the first set of formation images to form the second set of formation images.

13. The system of claim 12, wherein the information handling system apply a dielectric correction algorithm to each of the plurality of frequencies to produce a third set of formation images.

14. The system of claim 11, wherein the information handling system is further configured to apply a weighting function to each pixel of each of the first set of formation images and the second set of formation images.

15. The system of claim 14, wherein a switching algorithm is applied by setting the weights of any or all of the first set of formation images and the second set of formation images to be zero for any pixel of the first set of formation images and the second set of formation images.

16. The system of claim 14, wherein the weighting function uses a scaling factor.

17. The system of claim 16, wherein a scaling factor is dependent on frequency, a design of the downhole tool, or is determined empirically.

18. The system of claim 11, wherein the information handling system is configured to produce a processed image for each of the plurality of frequencies by combining the first set of formation images and the second set of formation images for a specific frequency.

19. The system of claim 18, wherein the information handling system is configured to apply a weighting function to each pixel of the processsed image corresponding to the specific frequency in the first set of formation images and the second set of formation images.

20. The system of claim 11, wherein the blended image is formed using a weighted averaging, a median selection, a minimum selection, or a maximum selection operation.

* * * * *